(12) United States Patent
Umehara et al.

(10) Patent No.: US 12,228,623 B2
(45) Date of Patent: Feb. 18, 2025

(54) MAGNETIC SENSOR, MAGNETIC ENCODER, LENS POSITION DETECTION DEVICE, DISTANCE MEASURING DEVICE, AND MANUFACTURING METHOD FOR MAGNETIC SENSOR

(71) Applicant: TDK CORPORATION, Tokyo (JP)

(72) Inventors: Tsuyoshi Umehara, Tokyo (JP); Kentaro Harada, Tokyo (JP); Yongfu Cai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 184 days.

(21) Appl. No.: 18/172,796

(22) Filed: Feb. 22, 2023

(65) Prior Publication Data
US 2023/0280419 A1   Sep. 7, 2023

(30) Foreign Application Priority Data

Mar. 1, 2022 (JP) ................................. 2022-031193

(51) Int. Cl.
*G01R 33/09* (2006.01)
*G01B 7/00* (2006.01)
*G01D 5/12* (2006.01)

(52) U.S. Cl.
CPC ........... *G01R 33/093* (2013.01); *G01B 7/003* (2013.01); *G01D 5/12* (2013.01); *G01R 33/091* (2013.01)

(58) Field of Classification Search
CPC ............ G01R 33/09–098; G01B 7/003; G01D 5/12–147; G01D 5/24471–24485; G01D 5/2451; G01D 5/2454

USPC ...................................................... 324/207.21
See application file for complete search history.

(56) References Cited

U.S. PATENT DOCUMENTS

| 2008/0068007 | A1* | 3/2008 | Hoshiya | G01D 5/145 |
| | | | | 324/207.21 |
| 2012/0119729 | A1 | 5/2012 | Komasaki et al. | |
| 2021/0325486 | A1 | 10/2021 | Cai | |
| 2022/0260654 | A1 | 8/2022 | Kobayashi | |
| 2023/0314178 | A1* | 10/2023 | Cai | G01D 5/145 |
| | | | | 356/4.01 |

FOREIGN PATENT DOCUMENTS

| EP | 2 267 413 A1 | 12/2010 |
| JP | 2010-281767 A | 12/2010 |
| JP | 2013-032989 A | 2/2013 |
| WO | 2009/031558 A1 | 3/2009 |

* cited by examiner

*Primary Examiner* — Eman A Alkafawi
*Assistant Examiner* — Rahul Maini
(74) *Attorney, Agent, or Firm* — Oliff PLC

(57) ABSTRACT

In a magnetic sensor, first and second resistors are provided in a path that connects a power supply port and a first output port, and third and fourth resistors are provided in a path that connects a ground port and the first output port. In a direction parallel to an X direction, both of a distance between the first resistor and the second resistor and a distance between the third resistor and the fourth resistor are λ/2, and a distance between the first resistor and the third resistor is zero. A magnetization of a magnetization pinned layer in the first and fourth resistors contains a component in a −X direction. The magnetization of the magnetization pinned layer in the second and third resistors contains a component in the X direction.

18 Claims, 12 Drawing Sheets

MAGNETIC SENSOR, MAGNETIC ENCODER, LENS POSITION DETECTION DEVICE, DISTANCE MEASURING DEVICE, AND MANUFACTURING METHOD FOR MAGNETIC SENSOR

CROSS REFERENCE TO RELATED APPLICATIONS

This application claims the benefit of Japanese Priority Patent Application No. 2022-31193 filed on Mar. 1, 2022, the entire contents of which are incorporated herein by reference.

BACKGROUND

The present technology relates to a magnetic sensor, a magnetic encoder, a lens position detection device, a distance measuring device, and a manufacturing method for the magnetic sensor.

A magnetic encoder using a magnetic sensor is used to detect the position of a movable object whose position changes in a predetermined direction. The predetermined direction is a linear direction or a rotational direction. The magnetic encoder used to detect the position of the movable object is configured so that the position of a magnetic field generator, such as a magnetic scale, relative to the magnetic sensor changes within a predetermined range depending on the change in the position of the movable object.

As the position of the magnetic field generator relative to the magnetic sensor changes, the strength of a component of a target magnetic field, which is generated by the magnetic field generator and applied to the magnetic sensor, in one direction changes. For example, the magnetic sensor detects the strength of the component of the target magnetic field in one direction, and generates two detection signals that correspond to the strength of the component in the one direction and have respective difference phases. The magnetic encoder generates a detection value having a correspondence with the position of the magnetic field generator relative to the magnetic sensor on the basis of the two detection signals.

A magnetic sensor including a plurality of magnetoresistive elements is used as the magnetic sensor for the magnetic encoder. For example, WO 2009/031558 and EP 2267413 A1 disclose a magnetic sensor in which a plurality of giant magnetoresistive (GMR) elements are arranged as the magnetoresistive elements in a direction of relative movement between a magnet and the magnetic sensor and a direction orthogonal to the direction of relative movement.

In particular, in the magnetic sensor disclosed in EP 2267413 A1, the plurality of GMR elements constitute a phase-A bridge circuit and a phase-B bridge circuit. In the magnetic sensor, the plurality of GMR elements are arranged in the direction of relative movement at center-to-center distances of $\lambda$, $\lambda/2$, or $\lambda/4$, with the center-to-center distance (pitch) of the N and S poles of the magnet as $\lambda$. The phase-A bridge circuit and the phase-B bridge circuit produce output waveforms $\lambda/2$ different in phase.

Suppose now that a voice coil motor is used as a driving unit of the movable object. The voice coil motor is formed of a magnet and a coil. When the magnetic encoder is used for detecting a position of the movable object, a stray field generated from the magnet of the voice coil motor is applied to the magnetic sensor in addition to the target magnetic field being a magnetic field for position detection generated from the magnetic field generator. In a process of research by the inventor of the present application, it is found that an error of the magnetic encoder depends on strength of a component of the stray field in the same direction as a direction of the magnetic field component of the target magnetic field.

SUMMARY

A magnetic sensor according to one embodiment of the technology is a magnetic sensor configured to detect a target magnetic field including a magnetic field component in a first direction. The magnetic sensor according to one embodiment of the technology includes a first resistor, a second resistor, a third resistor, and a fourth resistor each configured to change in resistance with change in strength of the magnetic field component, a power supply port, a ground port, and a first output port. The first resistor and the second resistor are provided in this order from the power supply port side in a first path that connects the power supply port and the first output port. The third resistor and the fourth resistor are provided in this order from the ground port side in a second path that connects the ground port and the first output port.

A distance between a first position in the first resistor and a second position in the second resistor in the first direction is equal to an odd number of times ½ of a predetermined pitch. A distance between a third position in the third resistor and a fourth position in the fourth resistor in the first direction is equal to an odd number of times ½ of the predetermined pitch. A distance between the first position and the third position in the first direction is equal to zero or an integral number of times of the predetermined pitch. The predetermined pitch is a length corresponding to one period of a change in the strength of the magnetic field component, on an assumption that the strength of the magnetic field component periodically changes with a predetermined period along the first direction.

The magnetic sensor according to one embodiment of the technology further includes a plurality of magnetoresistive elements. Each of the plurality of magnetoresistive elements includes a magnetization pinned layer, a free layer, and a gap layer located between the magnetization pinned layer and the free layer. The magnetization pinned layer has a first magnetization whose direction is fixed. The free layer has a second magnetization whose direction is variable within a plane parallel to both of the first direction and a second direction orthogonal to the first direction. The magnetization pinned layer, the free layer, and the gap layer are stacked in a third direction orthogonal to the first direction and the second direction. The first to fourth resistors are formed of the plurality of magnetoresistive elements.

The first magnetization of the magnetization pinned layer in the first and fourth resistors contains a component in a first magnetization direction being one direction parallel to the first direction. The first magnetization of the magnetization pinned layer in the second and third resistors contains a component in a second magnetization direction opposite to the first magnetization direction.

In the magnetic sensor according to one embodiment of the technology, the first position may be a center of gravity of the first resistor when viewed in one direction parallel to the third direction. The second position may be a center of gravity of the second resistor when viewed in one direction parallel to the third direction. The third position may be a center of gravity of the third resistor when viewed in one direction parallel to the third direction. The fourth position may be a center of gravity of the fourth resistor when viewed in one direction parallel to the third direction.

In the magnetic sensor according to one embodiment of the technology, the first resistor and the third resistor may adjoin in the second direction. The second resistor and the fourth resistor may adjoin in the second direction.

The magnetic sensor according to one embodiment of the technology may further include a fifth resistor, a sixth resistor, a seventh resistor, and an eighth resistor each configured to change in resistance with change in the strength of the magnetic field component, and a second output port. The fifth resistor and the sixth resistor may be provided in this order from the ground port side in a third path that connects the ground port and the second output port. The seventh resistor and the eighth resistor may be provided in this order from the power supply port side in a fourth path that connects the power supply port and the second output port.

A distance between a fifth position in the fifth resistor and a sixth position in the sixth resistor in the first direction may be equal to an odd number of times ½ of the predetermined pitch. A distance between a seventh position in the seventh resistor and an eighth position in the eighth resistor in the first direction may be equal to an odd number of times ½ of the predetermined pitch. A distance between the fifth position and the seventh position in the first direction may be equal to zero or an integral number of times of the predetermined pitch. A distance between the first position and the fifth position in the first direction may be equal to $(4n-3)/4$ of the predetermined pitch when n is an integer of 1 or more.

The fifth to eighth resistors may be formed of the plurality of magnetoresistive elements. The first magnetization of the magnetization pinned layer in the fifth and eighth resistors may contain a component in the second magnetization direction. The first magnetization of the magnetization pinned layer in the sixth and seventh resistors may contain a component in the first magnetization direction.

When the magnetic sensor according to one embodiment of the technology includes the fifth to eighth resistors, the fifth position may be a center of gravity of the fifth resistor when viewed in one direction parallel to the third direction. The sixth position may be a center of gravity of the sixth resistor when viewed in one direction parallel to the third direction. The seventh position may be a center of gravity of the seventh resistor when viewed in one direction parallel to the third direction. The eighth position may be a center of gravity of the eighth resistor when viewed in one direction parallel to the third direction.

When the magnetic sensor according to one embodiment of the technology includes the fifth to eighth resistors, the fifth resistor and the seventh resistor may adjoin in the second direction. The sixth resistor and the eighth resistor may adjoin in the second direction.

When the magnetic sensor according to one embodiment of the technology includes the fifth to eighth resistors, the first resistor may adjoin to the seventh resistor and may not adjoin to the eighth resistor. The eighth resistor may adjoin to the second resistor and may not adjoin to the first resistor. In this case, the third resistor may be located at a position such that the first resistor is sandwiched between the third resistor and the seventh resistor. The fourth resistor may be located at a position such that the second resistor is sandwiched between the fourth resistor and the eighth resistor. The fifth resistor may be located at a position such that the seventh resistor is sandwiched between the fifth resistor and the first resistor. The sixth resistor may be located at a position such that the eighth resistor is sandwiched between the sixth resistor and the second resistor.

In the magnetic sensor according to one embodiment of the technology, each of the plurality of magnetoresistive elements may be configured such that a bias magnetic field in a direction intersecting the first direction and the third direction is applied to the free layer.

In the magnetic sensor according to one embodiment of the technology, the gap layer may be a tunnel barrier layer.

A magnetic encoder according to one embodiment of the technology includes the magnetic sensor according to one embodiment of the technology, and a magnetic field generator configured to generate the target magnetic field. The magnetic sensor and the magnetic field generator are configured so that the strength of the magnetic field component in a reference position changes when at least one of the magnetic sensor and the magnetic field generator operates.

A lens position detection device according to one embodiment of the technology is intended to detect a position of a lens whose position is variable. The lens position detection device according to one embodiment of the technology includes the magnetic sensor according to one embodiment of the technology, and a magnetic field generator configured to generate the target magnetic field. The lens is configured to be movable in the first direction. The magnetic sensor and the magnetic field generator are configured so that the strength of the magnetic field component changes with a change in the position of the lens.

In the lens position detection device according to one embodiment of the technology, the magnetic field generator may be a magnetic scale including a plurality of pairs of N and S poles alternately arranged in the first direction.

A distance measuring device according to one embodiment of the technology is intended to measure a distance to a target object by detecting applied light. The distance measuring device according to one embodiment of the technology includes an optical element configured to rotate together when a traveling direction of the light changes, the magnetic sensor according to one embodiment of the technology, and a magnetic field generator configured to generate the target magnetic field. The magnetic field generator is configured to rotate about a rotation axis in conjunction with the optical element. The strength of the magnetic field component in the reference position changes according to rotation of the magnetic field generator.

In the distance measuring device according to one embodiment of the technology, the magnetic field generator may be a magnetic scale including a plurality of pairs of N and S poles alternately arranged around the rotation axis. In this case, the magnetic field generator may include an end surface located at an end in one direction parallel to the rotation axis. The plurality of pairs of N and S poles may be provided on the end surface. The magnetic sensor may be located to face the end surface. Alternatively, the magnetic field generator may include an outer circumferential surface directed to a direction away from the rotation axis. The plurality of pairs of N and S poles may be provided on the outer circumferential surface. The magnetic sensor may be located to face the outer circumferential surface.

A manufacturing method for a magnetic sensor according to one embodiment of the technology includes forming a plurality of magnetoresistive elements. The forming the plurality of magnetoresistive elements includes forming a plurality of initial magnetoresistive elements each including an initial magnetization pinned layer to later become the magnetization pinned layer, the free layer, and the gap layer, and fixing the first magnetization direction of the initial magnetization pinned layer by using laser light and an external magnetic field.

As described above, in the magnetic sensor, the magnetic encoder, the lens position detection device, and the distance measuring device according to one embodiment of the technology, the first to fourth resistors satisfy the requirement about the layout in the circuit configuration, the requirement about the physical layout, and the requirement about the magnetization of the magnetization pinned layer. In this way, according to one embodiment of the technology, an error due to a stray field can be reduced.

Other and further objects, features and advantages of the present technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
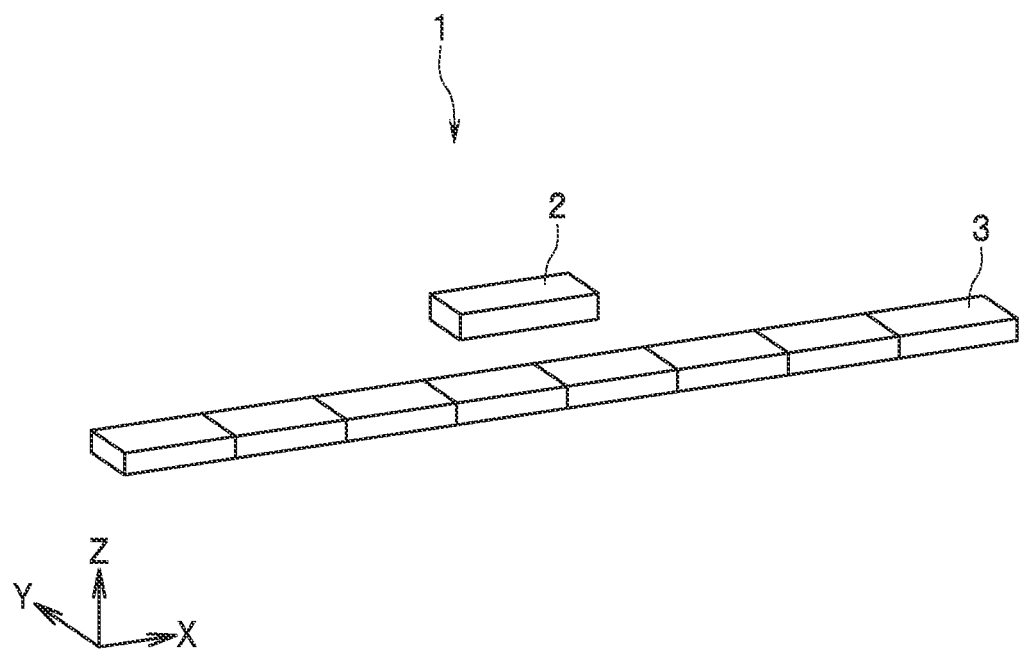
FIG. 1 is a perspective view showing a magnetic encoder according to a first example embodiment of the technology.

An object of the technology is to provide a magnetic sensor that can reduce an error due to a stray field, and a magnetic encoder, a lens position detection device, and a distance measuring device that each use the magnetic sensor.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
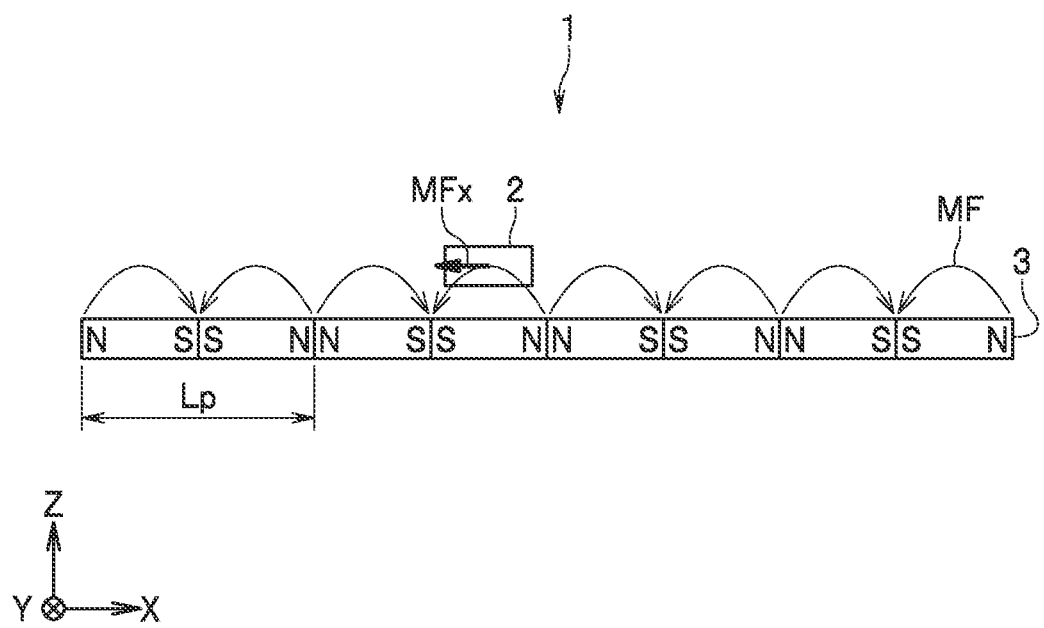
FIG. 2 is a front view showing the magnetic encoder according to the first example embodiment of the technology.

A schematic configuration of a magnetic encoder according to a first example embodiment of the technology will initially be described with reference to FIGS. 1 and 2. FIG. 1 is a perspective view showing a magnetic encoder 1. FIG. 2 is a front view showing the magnetic encoder 1. The magnetic encoder 1 according to the present example embodiment includes a magnetic sensor 2 according to the present example embodiment and a magnetic field generator 3.

The magnetic field generator 3 generates a target magnetic field MF that is a magnetic field for position detection and a magnetic field for the magnetic sensor 2 to detect (magnetic field to be detected). The target magnetic field MF includes a magnetic field component in a direction parallel to an imaginary straight line. The magnetic sensor 2 and the magnetic field generator 3 are configured so that the strength of the magnetic field component in a reference position changes when at least one of the magnetic sensor 2 and the magnetic field generator 3 operates. The reference position may be a position in which the magnetic sensor 2 is located. The magnetic sensor 2 detects the target magnetic field MF including the magnetic field component, and generates at least one detection signal corresponding to the strength of the magnetic field component.

An aspect of the operation of the magnetic sensor 2 and the magnetic field generator 3 includes a first aspect in which at least one of the magnetic sensor 2 and the magnetic field generator 3 moves, and a second aspect in which at least one of the magnetic sensor 2 and the magnetic field generator 3 rotates. In the first aspect, a relative position of the magnetic field generator 3 relative to the magnetic sensor 2 changes, but, in the second aspect, the relative position of the magnetic field generator 3 relative to the magnetic sensor 2 may not change.

The magnetic field generator 3 may be a magnetic scale including a plurality of pairs of N and S poles alternately arranged in a predetermined direction. The magnetic scale may be a magnetic medium, such as a magnetic tape, that is alternately magnetized to a plurality of pairs of N and S poles. The magnetic scale may be a plurality of magnets arranged along the foregoing predetermined direction. The predetermined direction may be a linear direction or a rotational direction. When the predetermined direction is the linear direction, the magnetic sensor 2 or the magnetic field generator 3 may be movable within a predetermined range along the linear direction. When the predetermined direction is the rotational direction, the magnetic sensor 2 or the magnetic field generator 3 may be rotatable within a predetermined range along the rotational direction.

In the present example embodiment, the magnetic field generator 3 is a linear scale magnetized to a plurality of pairs of N and S poles in a linear direction. The magnetic sensor 2 or the magnetic field generator 3 is movable along the longitudinal direction of the magnetic field generator 3. As shown in FIG. 2, the distance between two N poles adjoining in the longitudinal direction of the magnetic field generator 3, in other words, the distance between the two N poles adjoining via one S pole will be referred to as a magnetic pole distance. The size of the magnetic pole distance will be denoted by the symbol Lp.

Now, we define X, Y, and Z directions as shown in FIGS. 1 and 2. In the present example embodiment, a direction parallel to the longitudinal direction of the magnetic field generator 3 will be referred to as an X direction. Two mutually orthogonal directions perpendicular to the X direction are referred to as the Y and Z directions. In FIG. 2, the Y direction is shown as a direction from the near side to the far side of FIG. 2. The opposite directions to the X, Y, and Z directions will be referred to as –X, –Y, and —Z directions, respectively.

The magnetic sensor 2 is located away from the magnetic field generator 3 in the Z direction. The magnetic sensor 2 is configured to be able to detect the strength of a magnetic field component MFx of the target magnetic field MF at a predetermined position in a direction parallel to the X direction. For example, the strength of the magnetic field component MFx is expressed in positive values if the direction of the magnetic field component MFx is the X direction, and in negative values if the direction of the magnetic field component MFx is the –X direction. The strength of the magnetic field component MFx changes periodically as the magnetic sensor 2 or the magnetic field generator 3 moves along the direction parallel to the X direction. The direction parallel to the X direction corresponds to a "first direction" in the technology.

Figure 3:
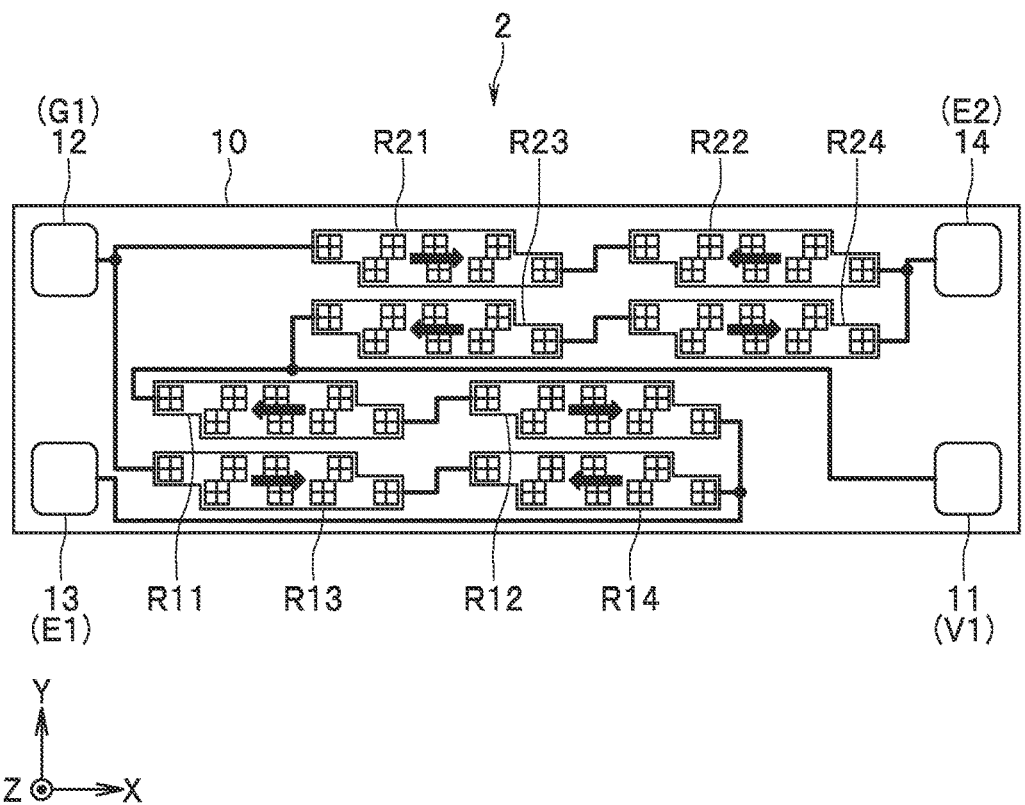
FIG. 3 is a plan view showing the magnetic sensor according to the first example embodiment of the technology.
Figure 4:
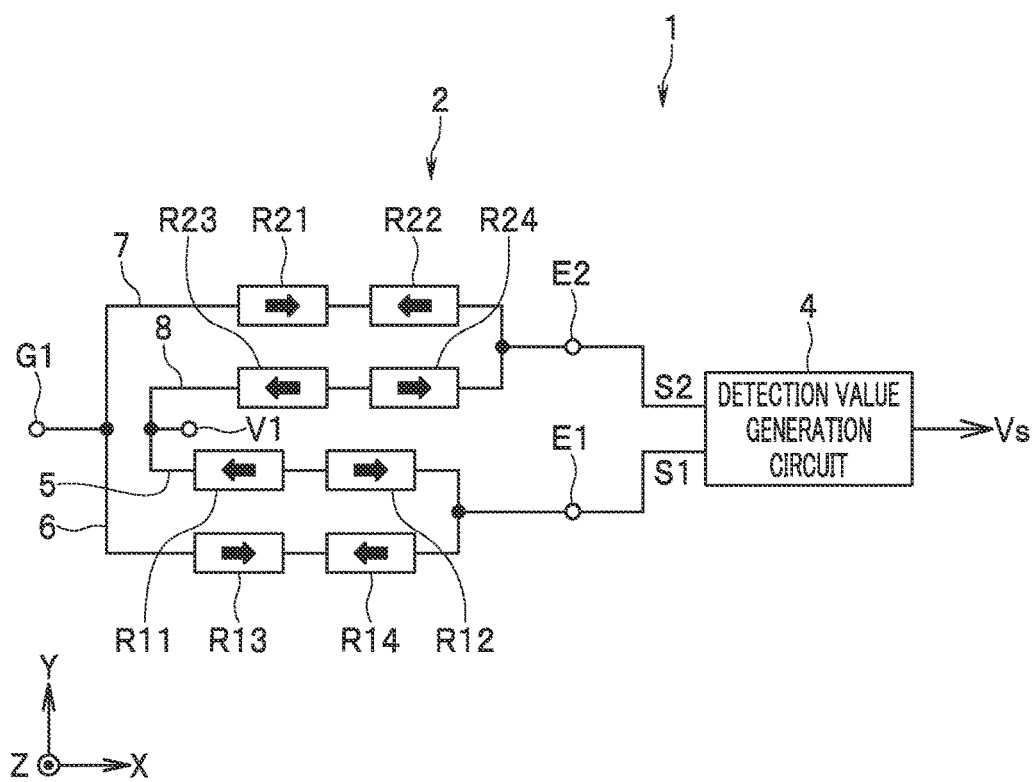
FIG. 4 is a circuit diagram showing the configuration of the magnetic sensor according to the first example embodiment of the technology.

Next, the magnetic sensor 2 will be described in detail with reference to FIGS. 3 and 4. FIG. 3 is a plan view showing the magnetic sensor 2. FIG. 4 is a circuit diagram showing the configuration of the magnetic sensor 2. As shown in FIG. 4, the magnetic encoder 1 further includes a detection value generation circuit 4. The detection value generation circuit 4 generates a detection value Vs having a correspondence with the position of the magnetic sensor 2 or the magnetic field generator 3 on the basis of the at least one detection signal corresponding to the strength of the magnetic field component MFx, generated by the magnetic sensor 2. The detection value generation circuit 4 can be implemented by an application specific integrated circuit (ASIC) or a microcomputer, for example.

The magnetic sensor 2 includes a first resistor R11, a second resistor R12, a third resistor R13, a fourth resistor R14, a fifth resistor R21, a sixth resistor R22, a seventh resistor R23, and an eighth resistor R24 each configured to change in resistance with the strength of the magnetic field component MFx. The magnetic sensor 2 includes a plurality of magnetoresistive elements (hereinafter, referred to as MR elements) 50. Each of the first to eighth resistors R11 to R14 and R21 to R24 is formed of the plurality of MR elements 50.

The magnetic sensor 2 further includes a power supply port V1, a ground port G1, a first output port E1, and a second output port E2. The ground port G1 is connected to the ground. The first and second output ports E1 and E2 are connected to the detection value generation circuit 4. The magnetic sensor 2 may be driven by a constant voltage or driven by a constant current. In the case where the magnetic sensor 2 is driven by a constant voltage, a voltage of predetermined magnitude is applied to the power supply port V1. In the case where the magnetic sensor 2 is driven by a constant current, a current of predetermined magnitude is supplied to the power supply port V1.

The magnetic sensor 2 generates a signal having a correspondence with the potential at the first output port E1 as a first detection signal S1, and generates a signal having a correspondence with the potential at the second output port E2 as a second detection signal S2. The detection value generation circuit 4 generates the detection value Vs on the basis of the first and second detection signals S1 and S2. At least one of the magnetic sensor 2 and the detection value generation circuit 4 may be configured to be able to correct the amplitude, phase, and offset of each of the first and second detection signals S1 and S2.

The first to eighth resistors R11 to R14 and R21 to R24 satisfy the following requirement about the layout in a circuit configuration. The first resistor R11 and the second resistor R12 are provided in this order from the power supply port V1 side in a first path 5 that connects the power supply port V1 and the first output port E1. The third resistor R13 and the fourth resistor R14 are provided in this order from the ground port G1 side in a second path 6 that connects the ground port G1 and the first output port E1. The fifth resistor R21 and the sixth resistor R22 are provided in this order from the ground port G1 side in a third path 7 that connects the ground port G1 and the second output port E2. The seventh resistor R23 and the eighth resistor R24 are provided in this order from the power supply port V1 side in a fourth path 8 that connects the power supply port V1 and the second output port E2.

As shown in FIG. 3, the magnetic sensor 2 further includes a substrate 10, and a power supply terminal 11, a ground terminal 12, a first output terminal 13, and a second output terminal 14 that are located on the substrate 10. The power supply terminal 11 constitutes the power supply port V1. The ground terminal 12 constitutes the ground port G1. The first and second output terminals 13 and 14 constitute the first and second output ports E1 and E2, respectively.

Figure 5:
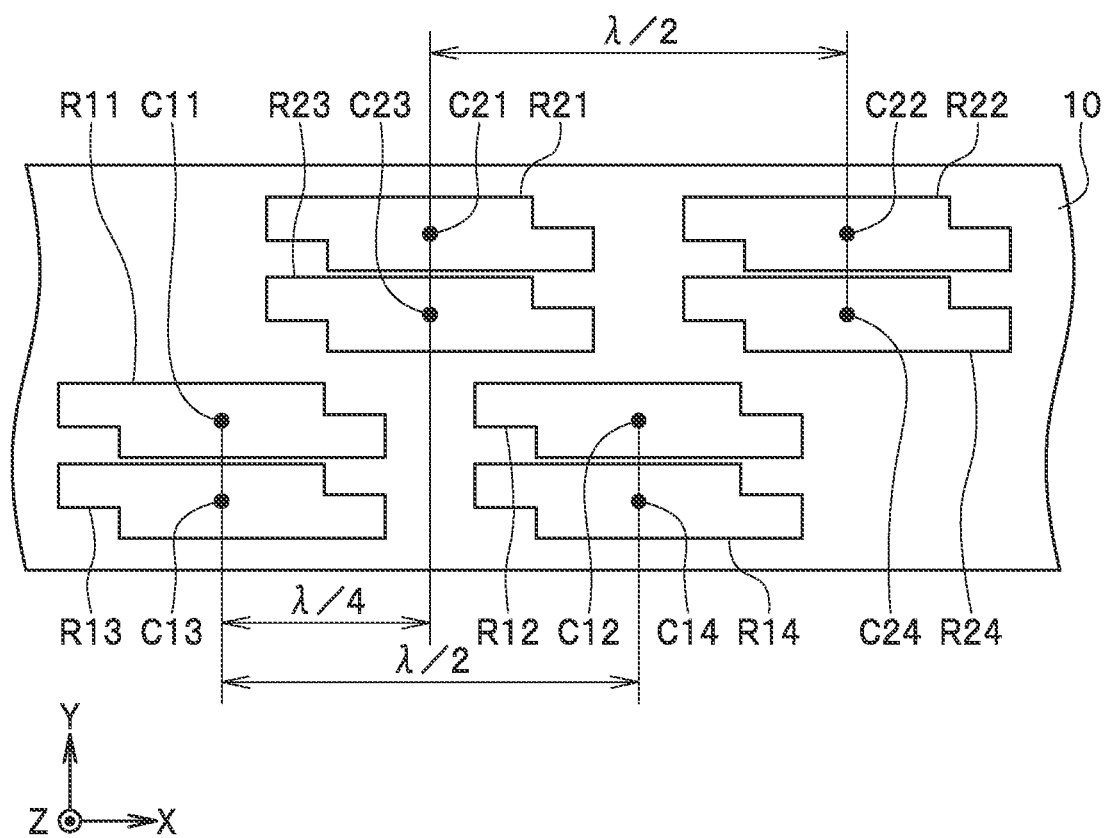
FIG. 5 is an explanatory diagram for describing the layout of first to eighth resistors of the first example embodiment of the technology.

Next, the layout of the first to eighth resistors R11 to R14 and R21 to R24 will be described with reference to FIG. 5. FIG. 5 is an explanatory diagram for describing the layout of the first to eighth resistors R11 to R14 and R21 to R24. Now, we define a predetermined pitch $\lambda$ as described below. On an assumption that the strength of the magnetic field component MFx periodically changes with a predetermined period along the direction parallel to the X direction, the pitch $\lambda$ is a length corresponding to one period of a change in the strength of the magnetic field component MFx.

When a specific magnetic field generator including a plurality of pairs of N and S poles is used, the pitch $\lambda$ is substantially equal to the distance between two N poles adjoining via one S pole. The specific magnetic field generator may be the magnetic field generator 3 shown in FIG. 2. In this case, the pitch $\lambda$ is equal to the magnetic pole distance Lp shown in FIG. 2. Alternatively, the specific magnetic field generator may be a magnetic field generator having a magnetic pole distance different from the magnetic pole distance Lp of the magnetic field generator 3. In this case, the pitch $\lambda$ has a size different from the magnetic pole distance Lp. A case where the specific magnetic field generator is the magnetic field generator 3, in other words, a case where the pitch $\lambda$ is equal to the magnetic pole distance Lp will be described as an example below.

In FIG. 5, a reference numeral C11 denotes a first position inside the first resistor R11, a reference numeral C12 denotes a second position inside the second resistor R12, a reference numeral C13 denotes a third position inside the third resistor R13, and a reference numeral C14 denotes a fourth position inside the fourth resistor R14. The first to fourth positions C11 to C14 are positions for determining physical positions of the first to fourth resistors R11 to R14, respectively. In particular, in the present example embodiment, the first position C11 is the center of gravity of the first resistor R11 when viewed in the Z direction, the second position C12 is the center of gravity of the second resistor R12 when viewed in the Z direction, the third position C13 is the center of gravity of the third resistor R13 when viewed in the Z direction, and the fourth position C14 is the center of gravity of the fourth resistor R14 when viewed in the Z direction.

In FIG. 5, a reference numeral C21 denotes a fifth position inside the fifth resistor R21, a reference numeral C22 denotes a sixth position inside the sixth resistor R22, a reference numeral C23 denotes a seventh position inside the seventh resistor R23, and a reference numeral C24 denotes an eighth position inside the eighth resistor R24. The fifth to eighth positions C21 to C24 are positions for determining physical positions of the fifth to eighth resistors R21 to R24, respectively. In particular, in the present example embodiment, the fifth position C21 is the center of gravity of the fifth resistor R21 when viewed in the Z direction, the sixth position C22 is the center of gravity of the sixth resistor R22 when viewed in the Z direction, the seventh position C23 is the center of gravity of the seventh resistor R23 when viewed in the Z direction, and the eighth position C24 is the center of gravity of the eighth resistor R24 when viewed in the Z direction.

The first to eighth resistors R11 to R14 and R21 to R24 satisfy the following requirement about the physical layout. A distance between the first position C11 and the second position C12 in the direction parallel to the X direction is equal to an odd number of times ½ of the pitch $\lambda$. A distance between the third position C13 and the fourth position C14 in the direction parallel to the X direction is equal to an odd number of times ½ of the pitch $\lambda$. A distance between the first position C11 and the third position C13 in the direction parallel to the X direction is equal to zero or an integral number of times of the pitch $\lambda$.

A distance between the fifth position C21 and the sixth position C22 in the direction parallel to the X direction is equal to an odd number of times ½ of the pitch $\lambda$. A distance between the seventh position C23 and the eighth position C24 in the direction parallel to the X direction is equal to an odd number of times ½ of the pitch $\lambda$. A distance between the fifth position C21 and the seventh position C23 in the direction parallel to the X direction is equal to zero or an integral number of times of the pitch $\lambda$. A distance between the first position C11 and the fifth position C21 in the direction parallel to the X direction is equal to $(4n-3)/4$ of the pitch $\lambda$. Note that n is an integer of one or more.

In the present example embodiment, the second position C12 is a position $\lambda/2$ away from the first position C11 in the X direction, and the fourth position C14 is a position $\lambda/2$ away from the third position C13 in the X direction. The distance between the first position C11 and the third position C13 in the direction parallel to the X direction is zero. In other words, the third position C13 in the direction parallel to the X direction is the same as the first position C11 in the same direction. The third position C13 is located in front of the first position C11 in the −Y direction. The fourth position C14 in the direction parallel to the X direction is the same as the second position C12 in the same direction. The fourth position C14 is located in front of the second position C12 in the −Y direction.

The fifth to eighth resistors R21 to R24 are located in front of the first to fourth resistors R11 to R14 in the Y direction. The physical layout of the fifth to eighth resistors R21 to R24 is similar to the physical layout of the first to fourth resistors R11 to R14. When the first to fourth resistors R11 to R14 and the first to fourth positions C11 to C14 in the description of the physical layout of the first to fourth resistors R11 to R14 are replaced by the fifth to eighth resistors R21 to R24 and the fifth to eighth positions C21 to C24, respectively, this corresponds to the description of the physical layout of the fifth to eighth resistors R21 to R24.

In the present example embodiment, the fifth position C21 (seventh position C23) is located $\lambda/4$ in front of the first position C11 (third position C13) in the X direction. The sixth position C22 (eighth position C24) is located $\lambda/4$ in front of the second position C12 (fourth position C14) in the X direction.

The first resistor R11 adjoins to the seventh resistor R23, but does not adjoin to the eighth resistor R24. The eighth resistor R24 adjoins to the second resistor R12, but does not adjoin to the first resistor R11.

The third resistor R13 is located at a position such that the first resistor R11 is sandwiched between the third resistor R13 and the seventh resistor R23. The fourth resistor R14 is located at a position such that the second resistor R12 is sandwiched between the fourth resistor R14 and the eighth resistor R24. The fifth resistor R21 is located at a position such that the seventh resistor R23 is sandwiched between the fifth resistor R21 and the first resistor R11. The sixth resistor R22 is located at a position such that the eighth resistor R24 is sandwiched between the sixth resistor R22 and the second resistor R12.

Next, a configuration of the first to eighth resistors R11 to R14 and R21 to R24 will be described. Each of the first and second detection signals S1 and S2 contains an ideal component which varies periodically with a predetermined signal period in such a manner as to trace an ideal sinusoidal curve (including sine and cosine waveforms). In the present example embodiment, the first to eighth resistors R11 to R14 and R21 to R24 are configured so that the ideal component of the first detection signal S1 and the ideal component of the second detection signal S2 have respective different phases. The magnetic pole distance Lp shown in FIG. 2 and the pitch λ, shown in FIG. 5 correspond to one period of the ideal component, in other words, an electrical angle of 360°.

Each of the first and second detection signals S1 and S2 contains a plurality of harmonic components corresponding to higher-order harmonics of the ideal component aside from the ideal component. In the present example embodiment, the first to eighth resistors R11 to R14 and R21 to R24 are configured to reduce the plurality of harmonic components.

The configuration of the first to eighth resistors R11 to R14 and R21 to R24 will be described in detail below. Initially, the configuration of the MR elements 50 will be described. In the present example embodiment, the MR elements 50 are each a spin-valve MR element. The spin-valve MR element includes a magnetization pinned layer, a free layer, and a gap layer located between the magnetization pinned layer and the free layer. The magnetization pinned layer has a first magnetization whose direction is fixed. The free layer has a second magnetization whose direction is variable within a plane (within an XY plane) parallel to both of the direction parallel to the X direction and a direction parallel to the Y direction. The magnetization pinned layer, the free layer, and the gap layer are stacked in a direction parallel to the Z direction. The direction parallel to the Y direction corresponds to a "second direction" in the technology. The direction parallel to the Z direction corresponds to a "third direction" in the technology.

The spin-valve MR element may be a tunneling magnetoresistive (TMR) element or a giant magnetoresistive (GMR) element. In particular, in the present example embodiment, the MR element 50 is desirably a TMR element to reduce the dimensions of the magnetic sensor 2. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°.

In FIGS. 3 and 4, arrows shown inside the first to eighth resistors R11 to R14 and R21 to R24 indicate first magnetization directions of the magnetization pinned layers in the respective plurality of MR elements 50 included in the resistors.

The first to eighth resistors R11 to R14 and R21 to R24 satisfy the following requirement about the magnetization of the magnetization pinned layer. The first magnetization of the magnetization pinned layer in the first and fourth resistors R11 and R14 contains a component in a first magnetization direction being one direction parallel to the above-described first direction (the direction parallel to the X direction). The first magnetization of the magnetization pinned layer in the second and third resistors R12 and R13 contains a component in a second magnetization direction opposite to the first magnetization direction. The first magnetization of the magnetization pinned layer in the fifth and eighth resistors R21 and R24 contains the component in the second magnetization direction. The first magnetization of the magnetization pinned layer in the sixth and seventh resistors R22 and R23 contains the component in the first magnetization direction. In particular, in the present example embodiment, the first magnetization direction is the −X direction, and the second magnetization direction is the X direction.

Note that, when the first magnetization contains a component in a specific magnetization direction, the component in the specific magnetization direction may be a main component of the first magnetization. Alternatively, the first magnetization may not contain a component in a direction orthogonal to the specific magnetization direction. In the present example embodiment, when the first magnetization contains the component in the specific magnetization direction, the first magnetization direction is the specific magnetization direction or substantially the specific magnetization direction.

The second magnetization directions of the free layers in the respective plurality of MR elements 50 change within the XY plane with the strength of the magnetic field component MFx. Consequently, the potential at each of the first and second output ports E1 and E2 changes with the strength of the magnetic field component MFx.

Next, the layout of the plurality of MR elements 50 in each of the first to eighth resistors R11 to R14 and R21 to R24 will be described. As employed herein, a set of one or more MR elements 50 will be referred to as an element group. Each of the first to eighth resistors R11 to R14 and R21 to R24 includes a plurality of the element groups. To reduce an error component, the plurality of element groups are located at predetermined distances from each other on the basis of the pitch λ. In the following description, the layout of the plurality of element groups will be described with reference to predetermined positions of the element groups. An example of the predetermined position of an element group is the center of gravity of the element group when viewed in the Z direction.

Figure 6:
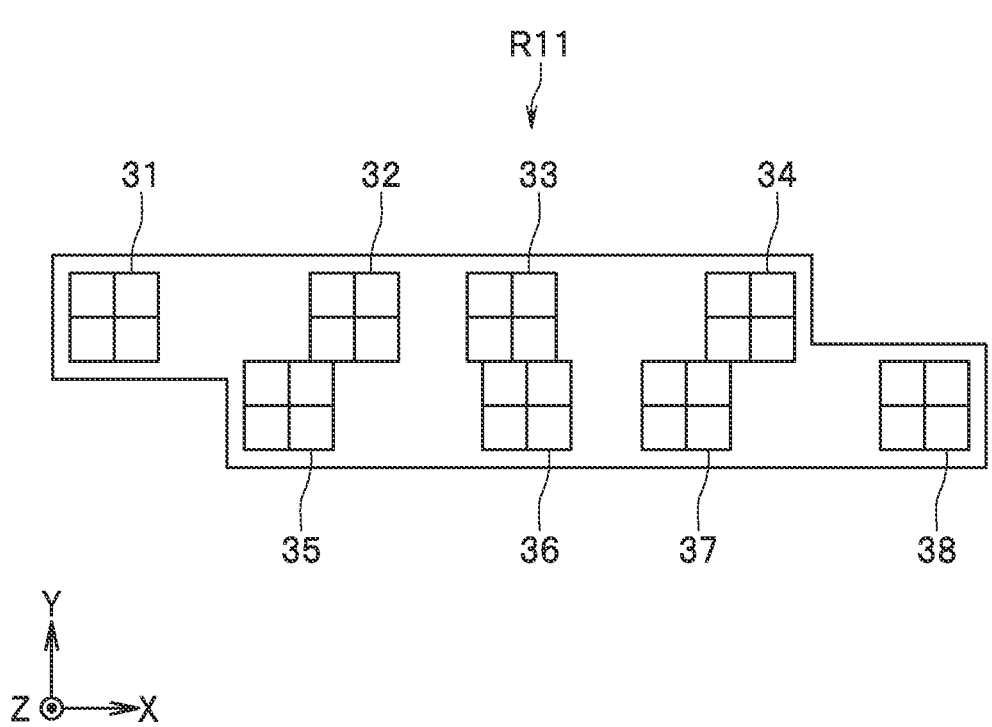
FIG. 6 is a plan view showing a first resistor of the first example embodiment of the technology.

FIG. 6 is a plan view showing the first resistor R11. As shown in FIG. 6, the first resistor R11 includes eight element groups 31, 32, 33, 34, 35, 36, 37, and 38. Each of the element groups 31 to 38 is divided into four sections. Each section includes one or more MR elements 50. In other words, each element group includes four or more MR elements 50. The plurality of MR elements 50 may be connected in series within each element group. In such a case, the plurality of element groups may be connected in series. Alternatively, the plurality of MR elements 50 may be connected in series regardless of the element groups.

In FIG. 6, the element groups 31 to 38 are located to reduce a harmonic component corresponding to a third harmonic (third-order harmonic) of the ideal component, a harmonic component corresponding to a fifth harmonic (fifth-order harmonic) of the ideal component, and a harmonic component corresponding to a seventh harmonic (seventh-order harmonic) of the ideal component. As shown in FIG. 6, the element groups 31 to 34 are arranged along the X direction. The element group 32 is located at a position V10 away from the element group 31 in the X direction. The element group 33 is located at a position V6 away from the element group 31 in the X direction. The element group 34 is located at a position V10+V6 away from the element group 31 in the X direction (at a position V6 away from the element group 32 in the X direction).

As shown in FIG. 6, the element groups 35 to 38 are arranged along the X direction, anterior to the element groups 31 to 34 in the −Y direction. The element group 35 is located at a position V14 away from the element group 31 in the X direction. The element group 36 is located at a position V14+V10 away from the element group 31 in the X direction (at a position V14 away from the element group 32 in the X direction). The element group 37 is located at a position V14+V6 away from the element group 31 in the X direction (at a position V14 away from the element group 33 in the X direction). The element group 38 is located at a position $\lambda/14+\lambda/10+\lambda/6$ away from the element group 31 in the X direction (at a position $\lambda/14$ away from the element group 34 in the X direction).

The layout of the plurality of element groups for reducing the plurality of harmonic components is not limited to the example shown in FIG. 6. Suppose now that k and m are integers that are greater than or equal to 1 and different from each other. For example, to reduce a harmonic component corresponding to a (2k+1)th-order harmonic, a first element group is located at a position $\lambda/(4k+2)$ away from a second element group in the X direction. Further, to reduce a harmonic component corresponding to a (2m+1)th-order harmonic, a third element group is located at a position $\lambda/(4m+2)$ away from the first element group in the X direction, and a fourth element group is located at a position $\lambda/(4m+2)$ away from the second element group in the X direction. In such a manner, to reduce harmonic components corresponding to a plurality of harmonics, each of a plurality of element groups for reducing a harmonic component corresponding to one harmonic is located at a position a predetermined distance based on the pitch $\lambda$ away from a corresponding one of a plurality of element groups for reducing a harmonic component corresponding to another harmonic in the X direction.

In the present example embodiment, the configuration and layout of the plurality of element groups in each of the second to eighth resistors R12 to R14 and R21 to R24 are the same as those of the plurality of element groups in the first resistor R11. More specifically, each of the second to eighth resistors R12 to R14 and R21 to R24 also includes the eight element groups 31 to 38 having the configuration and positional relationship shown in FIG. 6. Note that the element group 31 of the third resistor R13 is located at the same position as the element group 31 of the first resistor R11 is in the X direction. The element group 31 of the fourth resistor R14 is located at the same position as the element group 31 of the second resistor R12 is in the X direction. The element group 31 of the second resistor R12 is located at a position $\lambda/2$ away from the element group 31 of the first resistor R11 in the X direction. The element group 31 of the fourth resistor R14 is located at a position $\lambda/2$ away from the element group 31 of the third resistor R13 in the X direction.

The element group 31 of the seventh resistor R23 is located at the same position as the element group 31 of the fifth resistor R21 is in the X direction. The element group 31 of the eighth resistor R24 is located at the same position as the element group 31 of the sixth resistor R22 is in the X direction. The element group 31 of the fifth resistor R21 is located at a position $\lambda/4$ away from the element group 31 of the first resistor R11 in the X direction. The element group 31 of the sixth resistor R22 is located at a position $\lambda/2$ away from the element group 31 of the fifth resistor R21 in the X direction. The element group 31 of the eighth resistor R24 is located at a position $\lambda/2$ away from the element group 31 of the seventh resistor R23 in the X direction.

The configuration of the first to eighth resistors R11 to R14 and R21 to R24 described above makes a phase difference of the ideal component of the second detection signal S2 from the ideal component of the first detection signal S1 an odd number of times ¼ of a predetermined signal period (the signal period of the ideal component), and reduces the plurality of harmonic components of the respective first and second detection signals S1 and S2.

Note that, in the light of the production accuracy of the MR elements 50 and other factors, the positions of the first to eighth resistors R11 to R14 and R21 to R24 and the positions of the element groups 31 to 38 may be slightly different from the above-described positions.

Figure 7:
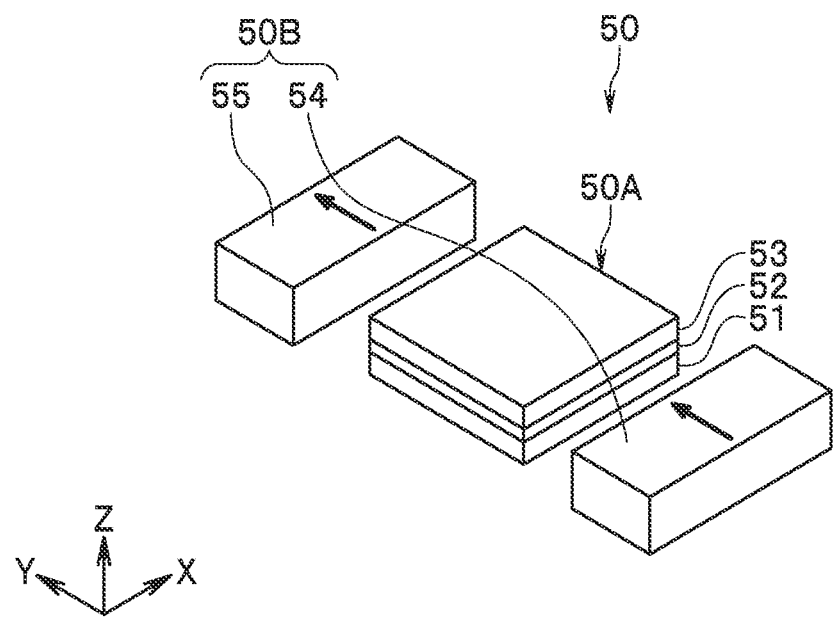
FIG. 7 is a perspective view showing a first example of a magnetoresistive element of the first example embodiment of the technology.

Next, first and second examples of the MR element 50 will be described with reference to FIGS. 7 and 8. FIG. 7 is a perspective view showing the first example of the MR element 50. In the first example, the MR element 50 includes a layered film 50A including a magnetization pinned layer 51, a gap layer 52, and a free layer 53 stacked in this order in the Z direction. The layered film 50A may have a circular planar shape, or a square or almost square planar shape as shown in FIG. 7 when viewed in the Z direction.

The bottom surface of the layered film 50A of the MR element 50 is electrically connected to the bottom surface of the layered film 50A of another MR element 50 by a not-shown lower electrode. The top surface of the layered film 50A of the MR element 50 is electrically connected to the top surface of the layered film 50A of yet another MR element 50 by a not-shown upper electrode. In such a manner, the plurality of MR elements 50 are connected in series. It should be appreciated that the layers 51 to 53 of each layered film 50A may be stacked in the reverse order to that shown in FIG. 7.

The MR element 50 further includes a bias magnetic field generator 50B that generates a bias magnetic field to be applied to the free layer 53. The direction of the bias magnetic field intersects the direction parallel to the X direction. In the first example, the bias magnetic field generator 50B includes two magnets 54 and 55. The magnet 54 is located in front of the layered film 50A in the −Y direction. The magnet 55 is located in front of the layered film 50A in the Y direction. In particular, in the first example, the layered film 50A and the magnets 54 and 55 are located at positions to intersect an imaginary plane parallel to the XY plane. In FIG. 7, the arrows in the magnets 54 and 55 indicate the magnetization directions of the magnets 54 and 55. In the first example, the direction of the bias magnetic field is the Y direction.

Figure 8:
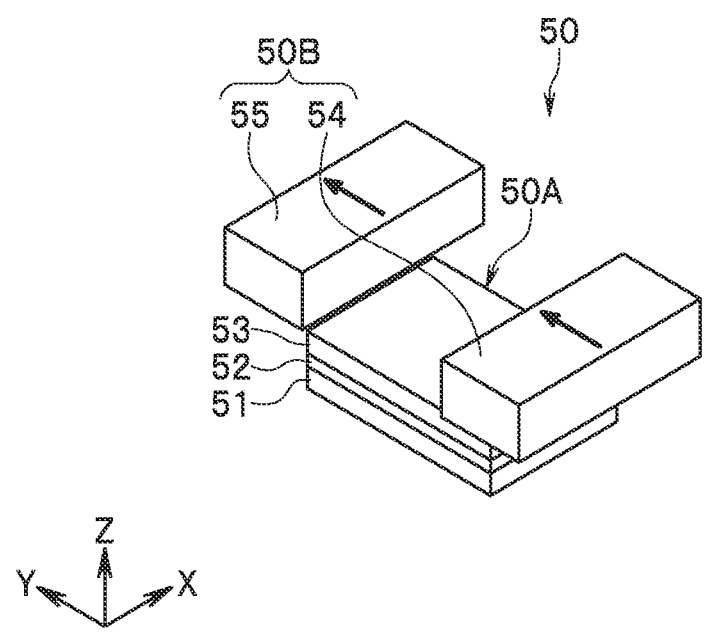
FIG. 8 is a perspective view showing a second example of the magnetoresistive element of the first example embodiment of the technology.

FIG. 8 is a perspective view showing the second example of the MR element 50. The second example of the MR element 50 has the same configuration as that of the first example of the MR element 50 except the planar shape of the layered film 50A and the positions of the magnets 54 and 55. In the second example, the magnets 54 and 55 are located at positions different from that of the layered film 50A in the Z direction. In particular, in the example shown in FIG. 8, the magnets 54 and 55 are located in front of the layered film 50A in the Z direction. When viewed in the Z direction, the layered film 50A has a rectangular planar shape long in the Y direction. When viewed in the Z direction, the magnets 54 and 55 are located to overlap the layered film 50A.

The direction of the bias magnetic field and the layout of the magnets 54 and 55 are not limited to the examples shown in FIGS. 7 and 8. For example, the direction of the bias magnetic field may be a direction intersecting the direction parallel to the X direction and the direction parallel to the Z direction, and may be a direction oblique to the Y direction. The magnets 54 and 55 may be located at respective different positions in the direction parallel to the X direction.

The bias magnetic field may be applied to the free layer 53 by uniaxial magnetic anisotropy such as magnetic shape anisotropy or magnetocrystalline anisotropy instead of the bias magnetic field generator 50B.

Next, a method for generating the detection value Vs of the present example embodiment will be described. For example, the detection value generation circuit 4 generates the detection value Vs in the following manner. The detection value generation circuit 4 determines an initial detection value in the range of 0° or more and less than 360° by calculating the arctangent of the ratio of the second detection signal S2 to the first detection signal S1, i.e., atan (S2/S1). The initial detection value may be the value of the arctangent itself. The initial detection value may be a value obtained by adding a predetermined angle to the value of the arctangent.

If the foregoing value of the arctangent is 0°, the position of an S pole of the magnetic field generator 3 and the position of the element group 31 in each of the first and third resistors R11 and R13 coincide in the X direction. If the foregoing value of the arctangent is 180°, the position of an N pole of the magnetic field generator 3 and the position of the element group 31 in each of the first and third resistors R11 and R13 coincide in the X direction. The initial detection value thus has a correspondence with the position of the magnetic field generator 3 relative to the magnetic sensor 2 (hereinafter, also referred to as a relative position) within the magnetic pole distance Lp.

The detection value generation circuit 4 also counts the number of rotations of the electrical angle from a reference position, with one period of the initial detection value as an electrical angle of 360°. One rotation of the electrical angle corresponds to the amount of movement of the relative position as much as the magnetic pole distance Lp. The detection value generation circuit 4 generates the detection value Vs having a correspondence with the relative position on the basis of the initial detection value and the number of rotations of the electrical angle.

Next, a manufacturing method for the magnetic sensor 2 according to the present example embodiment will be briefly described. The manufacturing method for the magnetic sensor 2 includes a step of forming the plurality of MR elements 50 on the substrate 10, a step of forming the terminals 11 to 14 on the substrate 10, and a step of forming a plurality of wirings connected to the plurality of MR elements 50 and the terminals 11 to 14.

In the step of forming the plurality of MR elements 50, a plurality of initial MR elements to later become the plurality of MR elements 50 are initially formed. Each of the plurality of initial MR elements includes an initial magnetization pinned layer to later become the magnetization pinned layer 51, the free layer 53, and the gap layer 52.

Next, the magnetization directions of the initial magnetization pinned layers are fixed to predetermined directions using laser light and external magnetic fields in the foregoing predetermined directions. For example, a plurality of initial MR elements to later become the plurality of MR elements 50 constituting the first, fourth, sixth, and seventh resistors R11, R14, R22, and R23 are irradiated with laser light while an external magnetic field in the first magnetization direction (−X direction) is applied thereto.

When the irradiation with the laser light is completed, the magnetization directions of the initial magnetization pinned layers are fixed to the first magnetization direction. This makes the initial magnetization pinned layers into the magnetization pinned layers 51, and the plurality of initial MR elements into the plurality of MR elements 50 constituting the first, fourth, sixth, and seventh resistors R11, R14, R22, and R23.

In a plurality of other initial MR elements to later become the plurality of MR elements 50 constituting the second, third, fifth, and eighth resistors R12, R13, R21, and R24, the magnetization direction of the initial magnetization pinned layer in each of the plurality of other initial MR elements can be fixed to the second magnetization direction (X direction) by setting the direction of the external magnetic field to the second magnetization direction. The plurality of MR elements 50 are formed in such a manner.

Next, the operation and effects of the magnetic encoder 1 and the magnetic sensor 2 according to the present example embodiment will be described. In the present example embodiment, the first to fourth resistors R11 to R14 satisfy the requirement about the layout in the circuit configuration, the requirement about the physical layout, and the requirement about the magnetization of the magnetization pinned layer as described above. In this way, according to the present example embodiment, an error due to a stray field in the direction parallel to the X direction can be reduced.

Suppose now a case where only a stray field is applied to the magnetic sensor 2. For example, when a direction of the stray field is the X direction, the free layer in each of the first to fourth resistors R11 to R14 is tilted from the Y direction to the X direction by the stray field. In this case, the resistance of the first and fourth resistors R11 and R14 increases, and the resistance of the second and third resistors R12 and R13 decreases. Thus, the resistance of the first path 5 provided with the first and second resistors R11 and R12 and the resistance of the second path 6 provided with the third and fourth resistors R13 and R14 do not change or hardly change.

A change in the resistance of the first to fourth resistors R11 to R14 when the direction of the stray field is the −X direction is reversed to that when the direction of the stray field described above is the X direction.

Consequently, according to the present example embodiment, an error of the first detection signal S1 due to the stray field can be reduced.

Similarly, in the present example embodiment, the fifth to eighth resistors R21 to R24 satisfy the requirement about the layout in the circuit configuration, the requirement about the physical layout, and the requirement about the magnetization of the magnetization pinned layer as described above. In this way, according to the present example embodiment, an error of the second detection signal S2 due to the stray field can be reduced.

Consequently, according to the present example embodiment, an error of the detection value Vs due to the stray field can be reduced.

Next, the effects of the present example embodiment will be further described in detail with reference to first and second simulation results. A model of a practical example and a model of a comparative example used in the first and second simulation will initially be described. The model of the practical example is a model for the magnetic sensor 2 according to the present example embodiment. The model of the comparative example is a model for a magnetic sensor 102 of the comparative example.

Figure 9:
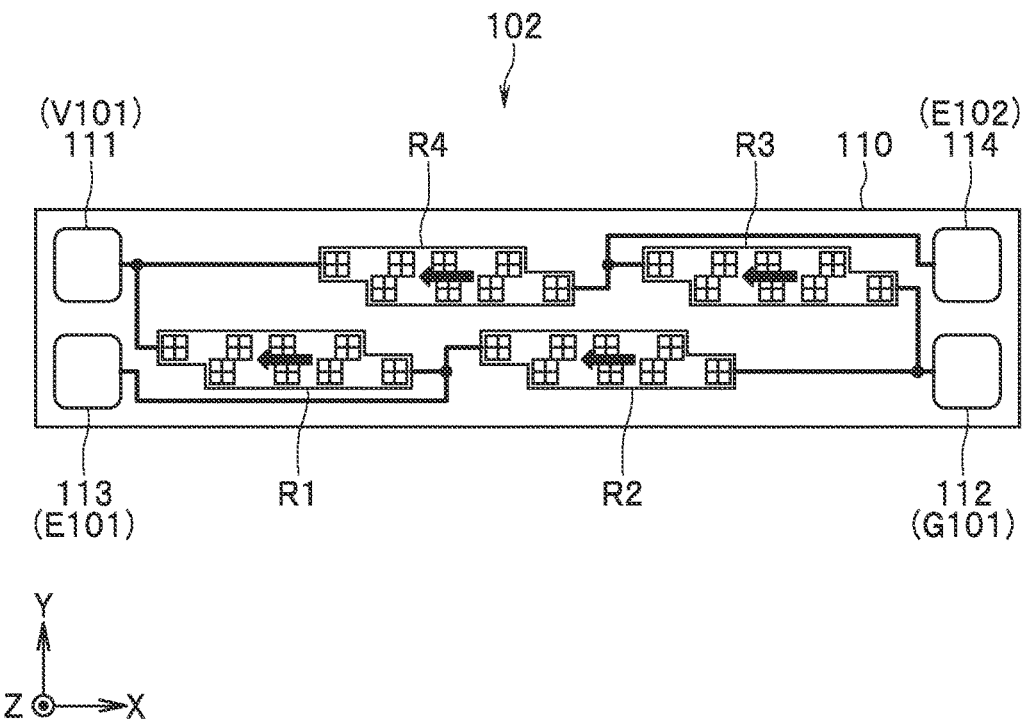
FIG. 9 is a plan view showing a magnetic sensor of a comparative example.
Figure 10:
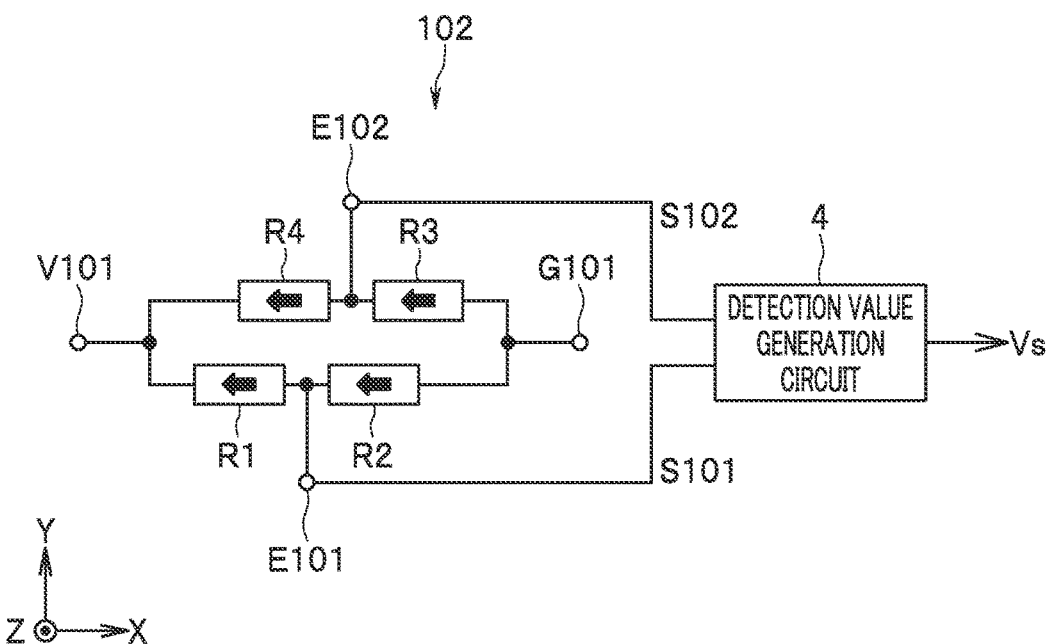
FIG. 10 is a circuit diagram showing the configuration of the magnetic sensor of the comparative example.

FIG. 9 is a plan view showing the magnetic sensor 102 of the comparative example. FIG. 10 is a circuit diagram showing the configuration of the magnetic sensor 102 of the comparative example. The magnetic sensor 102 includes a first resistor R1, a second resistor R2, a third resistor R3, and a fourth resistor R4 each configured to change in resistance with the strength of the magnetic field component MFx. The magnetic sensor 102 includes the plurality of MR elements 50. Each of the first to fourth resistors R1 to R4 is formed of the plurality of MR elements 50.

The magnetic sensor 102 further includes a power supply port V101, a ground port G101, a first output port E101, and a second output port E102. The ground port G101 is connected to the ground. The first and second output ports E101 and E102 are connected to the detection value generation circuit 4.

The magnetic sensor 102 generates a signal having a correspondence with the potential at the first output port E101 as a first detection signal S101, and generates a signal having a correspondence with the potential at the second output port E102 as a second detection signal S102. The detection value generation circuit 4 connected to the magnetic sensor 102 generates the detection value Vs on the basis of the first and second detection signals S101 and S102.

The first resistor R1 is provided in a path that connects the power supply port V101 and the first output port E101. The second resistor R2 is provided in a path that connects the ground port G101 and the first output port E101. The third resistor R3 is provided in a path that connects the ground port G101 and the second output port E102. The fourth resistor R4 is provided in a path that connects the power supply port V101 and the second output port E102.

The center of gravity of the second resistor R2 when viewed in the Z direction is located at a position V2 in the X direction away from the center of gravity of the first resistor R1 when viewed in the Z direction. The center of gravity of the third resistor R3 when viewed in the Z direction is located at a position V2 in the X direction away from the center of gravity of the fourth resistor R4 when viewed in the Z direction. The center of gravity of the fourth resistor R4 when viewed in the Z direction is located at a position V4 in the X direction away from the center of gravity of the first resistor R1 when viewed in the Z direction.

In FIGS. 9 and 10, arrows shown inside the first to fourth resistors R1 to R4 indicate first magnetization directions of magnetization pinned layers in the respective plurality of MR elements 50 included in the resistors. In the comparative example, the first magnetization directions are the −X direction in all of the first to fourth resistors R1 to R4.

Each of the first to fourth resistors R1 to R4 includes a plurality of element groups. The configuration and layout of the plurality of element groups in each of the first to fourth resistors R1 to R4 are the same as those of the plurality of element groups in the first resistor R11 of the magnetic sensor 2 according to the present example embodiment.

Next, a condition of the first simulation will be described. In the first simulation, both of the pitch λ and the magnetic pole distance Lp were 800 µm. Further, both of a distance between the magnetic sensor 2 and the magnetic field generator 3 in the direction parallel to the Z direction, and a distance between the magnetic sensor 102 and the magnetic field generator 3 in the direction parallel to the Z direction were 0.15 mm. Further, both a voltage applied to the power supply port V1 and a voltage applied to the power supply port V101 were 1 V.

In the first simulation, the relative position of the magnetic field generator 3 relative to the magnetic sensor 2 or 102 was changed in the direction parallel to the X direction while applying a stray field (a magnetic field parallel to the X direction) having a fixed direction and constant strength to the magnetic sensor 2 or 102. Then, a maximum value Vpp of a peak-to-peak value of the first detection signal S1 or S101 and a maximum value of an error (hereinafter, referred to simply as an error) of the detection value Vs when the relative position was changed were determined. In the first simulation, the relative position was changed by 3200 µm.

Hereinafter, the strength of the stray field when the direction of the stray field is the X direction will be denoted by a positive value, and the strength of the stray field when the direction of the stray field is the −X direction will be denoted by a negative value. The strength of the stray field will be denoted by magnitude of magnetic flux density corresponding to the strength of the stray field. In the first simulation, the stray field was changed within a range from −14 mT to 14 mT.

Figure 11:
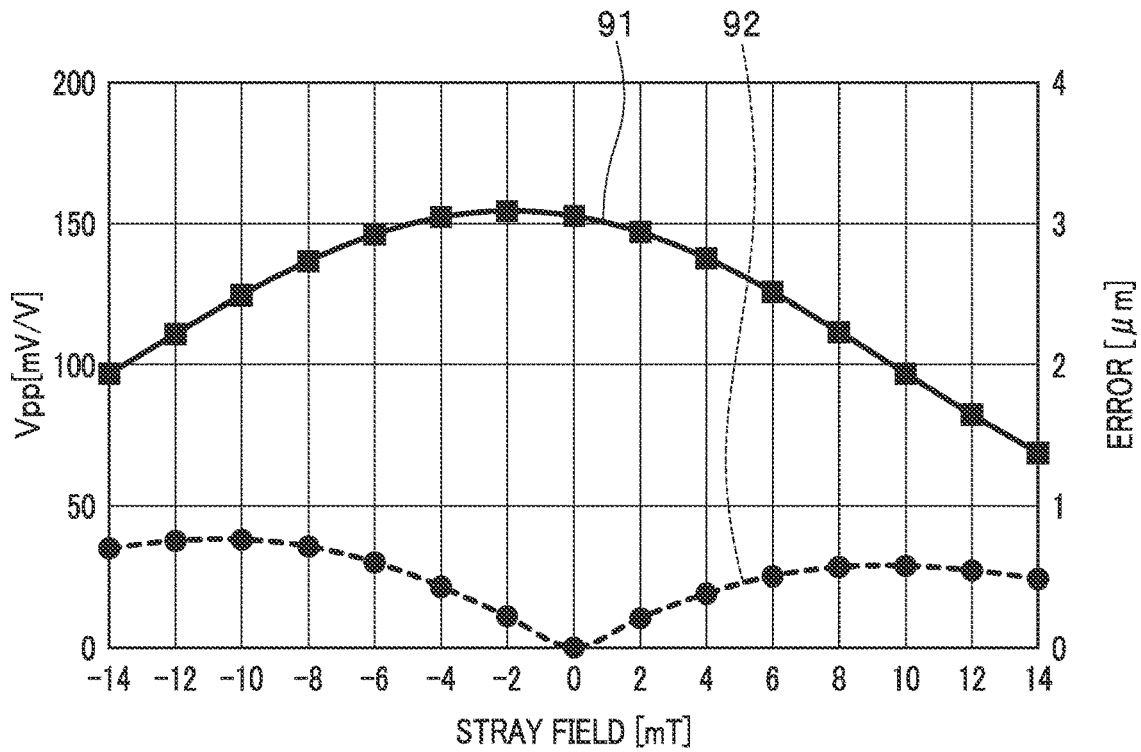
FIG. 11 is a characteristic chart showing Vpp and an error of a model of the comparative example determined by a first simulation.
Figure 12:
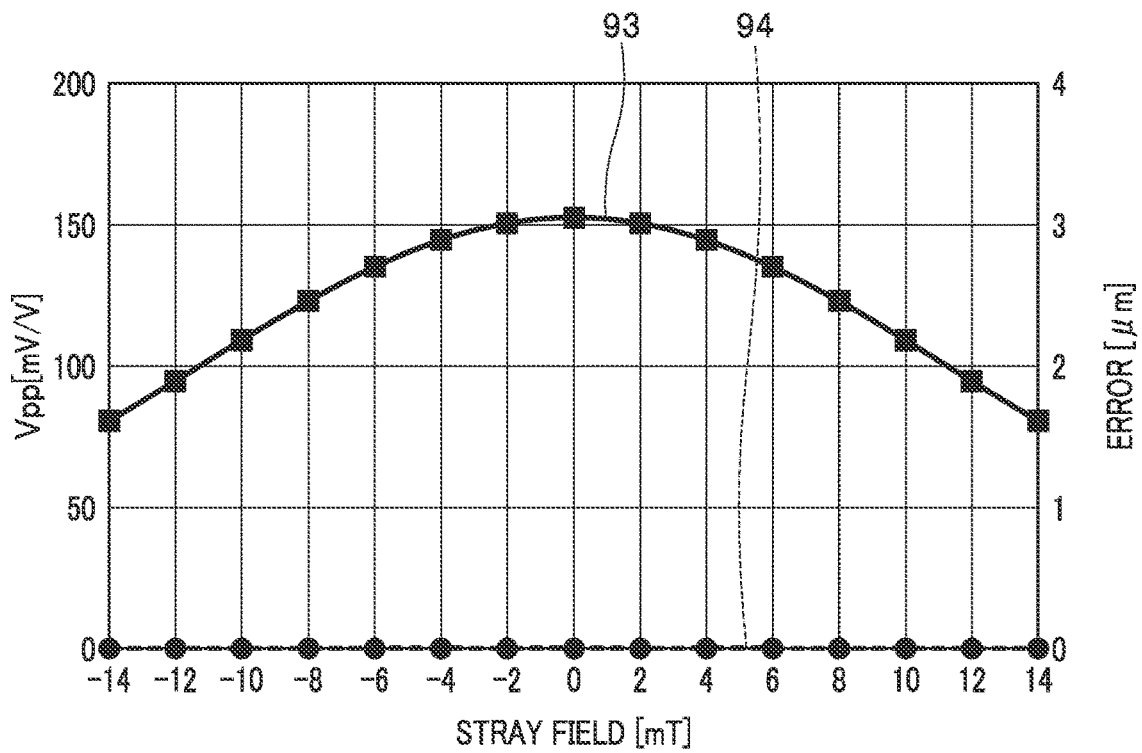
FIG. 12 is a characteristic chart showing Vpp and an error of a model of a practical example determined by the first simulation.

Next, the first simulation result will be described. FIG. 11 is a characteristic chart showing Vpp and an error of the model of the comparative example determined by the first simulation. FIG. 12 is a characteristic chart showing Vpp and an error of the model of the practical example determined by the first simulation. In FIGS. 11 and 12, a horizontal axis represents a stray field, a vertical axis on a left side represents Vpp, and a vertical axis on a right side represents the error. In FIG. 11, a curve line denoted by a reference numeral 91 represents Vpp, and a curve line denoted by a reference numeral 92 represents the error. In FIG. 12, a curve line denoted by a reference numeral 93 represents Vpp, and a curve line denoted by a reference numeral 94 represents the error.

As can be seen from the first simulation result shown in FIGS. 11 and 12, according to the present example embodiment, the error can be reduced as compared to the magnetic sensor 102 of the comparative example. In particular, the error of the model of the practical example is substantially zero in the first simulation.

Next, a condition of the second simulation will be described. The condition of the second simulation is the same as that of the first simulation except for a stray field. In the second simulation, a stray field (a magnetic field parallel to the X direction) whose strength changes according to the relative position was applied to the magnetic sensor 2 or 102 instead of the stray field having the fixed direction and the constant strength. In the second simulation, a ratio of a change in the strength of the stray field to the relative position was changed within a range from −5 mT/mm to 5 mT/mm. Note that the strength of the stray field when the relative position was 0 µm was 0 mT. Therefore, for example, when the ratio of the change in the strength of the stray field to the relative position is −3 mT/mm, the strength of the stray field when the relative position is 3200 µm is −9.6 mT.

Figure 13:
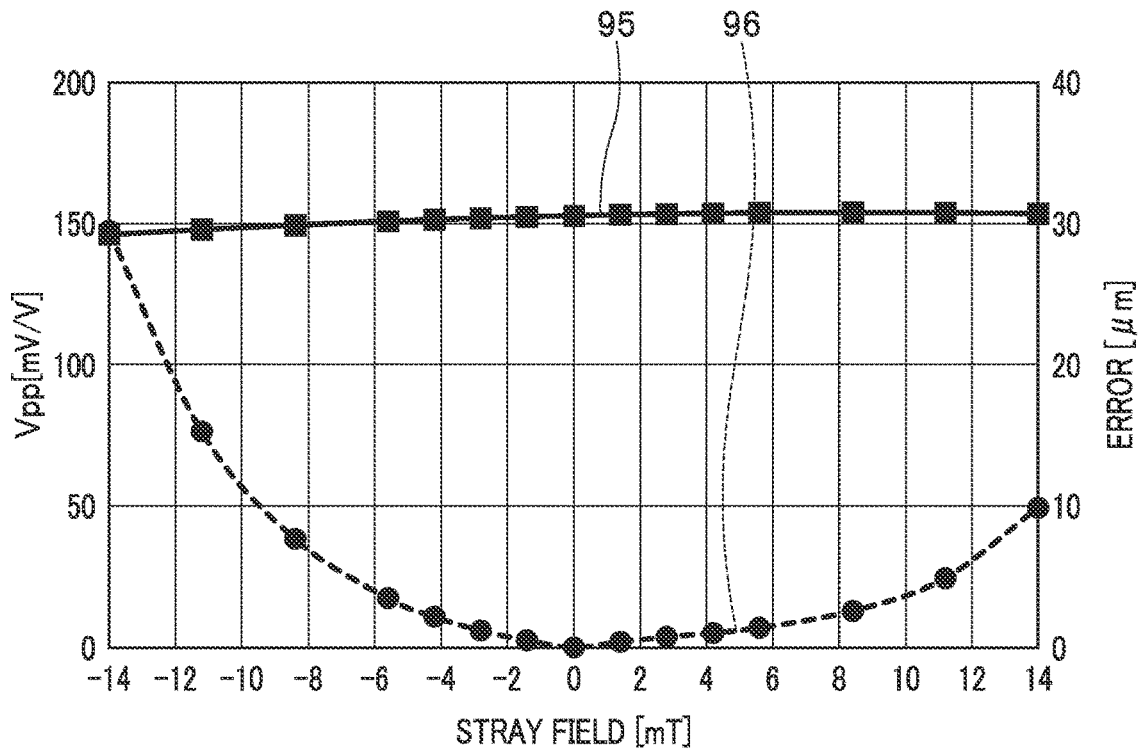
FIG. 13 is a characteristic chart showing Vpp and an error of a model of the comparative example determined by a second simulation.
Figure 14:
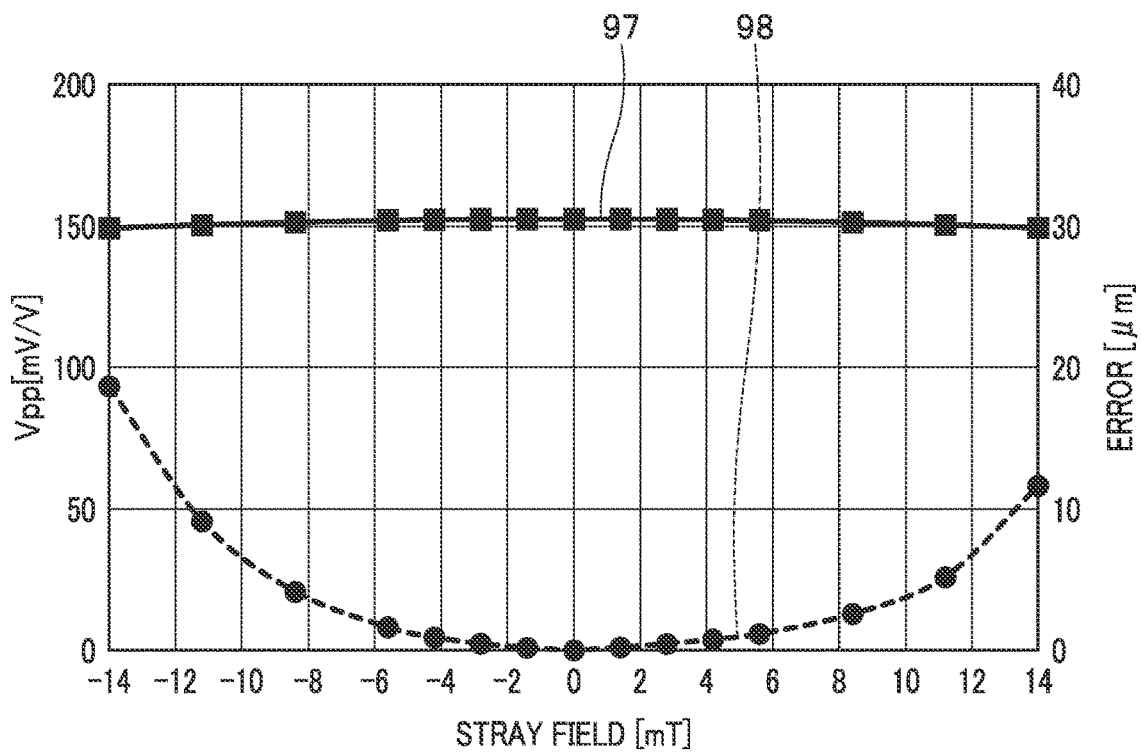
FIG. 14 is a characteristic chart showing Vpp and an error of a model of the practical example determined by the second simulation.

Next, the second simulation result will be described. FIG. 13 is a characteristic chart showing Vpp and an error of the model of the comparative example determined by the second simulation. FIG. 14 is a characteristic chart showing Vpp and an error of the model of the practical example determined by the second simulation. In FIGS. 13 and 14, a horizontal axis represents a stray field, a vertical axis on the left side represents Vpp, and a vertical axis on the right side represents the error. In FIG. 13, a curve line denoted by a reference numeral 95 represents Vpp, and a curve line denoted by a reference numeral 96 represents the error. In FIG. 14, a curve line denoted by a reference numeral 97 represents Vpp, and a curve line denoted by a reference numeral 98 represents the error.

As can be seen from the second simulation result shown in FIGS. 13 and 14, according to the present example embodiment, the error particularly when the ratio of the change in the strength of the stray field to the relative position is a negative value can be reduced as compared to the magnetic sensor 102 of the comparative example.

Second Example Embodiment

Figure 15:
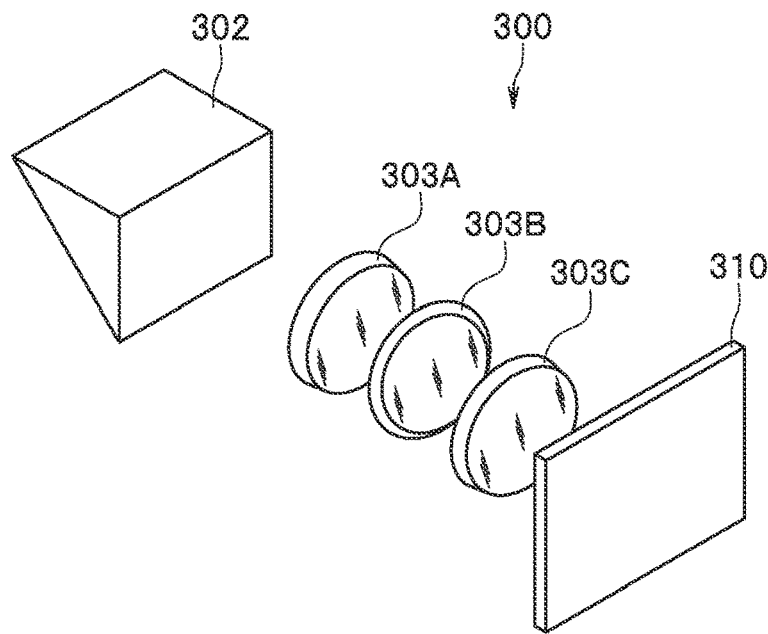
FIG. 15 is a perspective view showing a lens module including a position detection device according to a second example embodiment of the technology.
Figure 16:
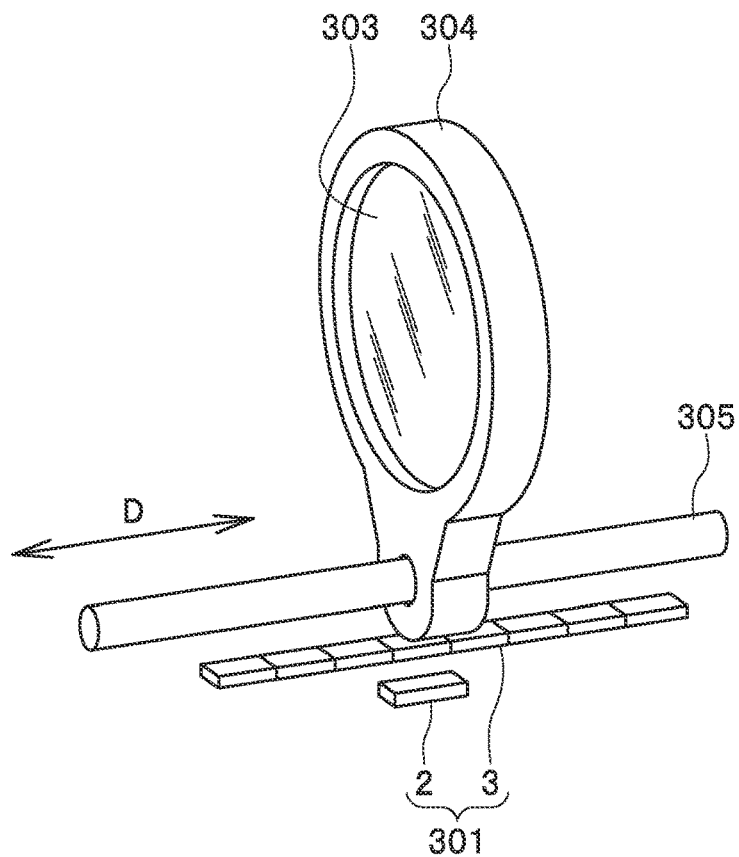
FIG. 16 is a perspective view showing the position detection device according to the second example embodiment of the technology.

Next, a lens position detection device (hereinafter, referred to simply as a position detection device) according to a second example embodiment of the technology will be described with reference to FIGS. 15 and 16. FIG. 15 is a perspective view showing a lens module including the position detection device according to the present example embodiment. FIG. 16 is a perspective view showing the position detection device according to the present example embodiment.

A lens module 300 shown in FIG. 15 constitutes a part of a smartphone camera, for example. The lens module 300 is used in combination with an image sensor 310 using a complementary metal-oxide-silicon (CMOS) sensor or the like. In the example shown in FIG. 15, the lens module 300 includes a triangular prism 302, and three lenses 303A, 303B, and 303C located between the image sensor 310 and the prism 302. At least one of the lenses 303A, 303B, and 303C is configured to be movable by a not-shown driving unit so that at least one of focusing and zooming can be performed.

FIG. 16 shows a lens 303 among the lenses 303A, 303B, and 303C. The lens module 300 further includes a lens holder 304 that holds the lens 303, and a shaft 305. The lens module 300 can change the position of the lens 303 in an optical axis direction of the lens 303 by using the lens holder 304, the shaft 305, and the not-shown driving unit. In FIG. 16, the arrow denoted by the symbol D indicates the moving direction of the lens 303.

The lens module 300 further includes a position detection device 301 for detecting the position of the lens 303 whose position is variable. The position detection device 301 is used to detect the position of the lens 303 in performing focusing or zooming.

The position detection device 301 is a magnetic position detection device, and includes the magnetic sensor 2 and the magnetic field generator 3 described in the first example embodiment. In the lens module 300, the magnetic sensor 2 and the magnetic field generator 3 are configured so that the strength of the magnetic field component MFx (see FIG. 2) changes as the position of the lens 303 changes in the moving direction D. Specifically, the magnetic sensor 2 is fixed, and the magnetic field generator 3 is configured to be movable with the lens 303 in the moving direction D. The moving direction D is parallel to the X direction shown in FIGS. 1 and 2. When the position of the lens 303 changes, the position of the magnetic field generator 3 relative to the magnetic sensor 2 thus changes, and as a result, the strength of the magnetic field component MFx changes.

The position detection device 301 further includes the detection value generation circuit 4 described in the first example embodiment (see FIG. 4). The position detection device 301 generates a detection value Vs having a correspondence with the position of the lens 303 on the basis of the first and second detection signals S1 and S2 generated by the magnetic sensor 2. The position of the lens 303 has a correspondence with the position of the magnetic field generator 3 relative to the magnetic sensor 2. The method for generating the detection value Vs by the position detection device 301 is similar to the method for generating the detection value Vs in the first example embodiment.

The configuration, operation and effects of the present example embodiment are otherwise the same as those of the first example embodiment.

Third Example Embodiment

Figure 17:
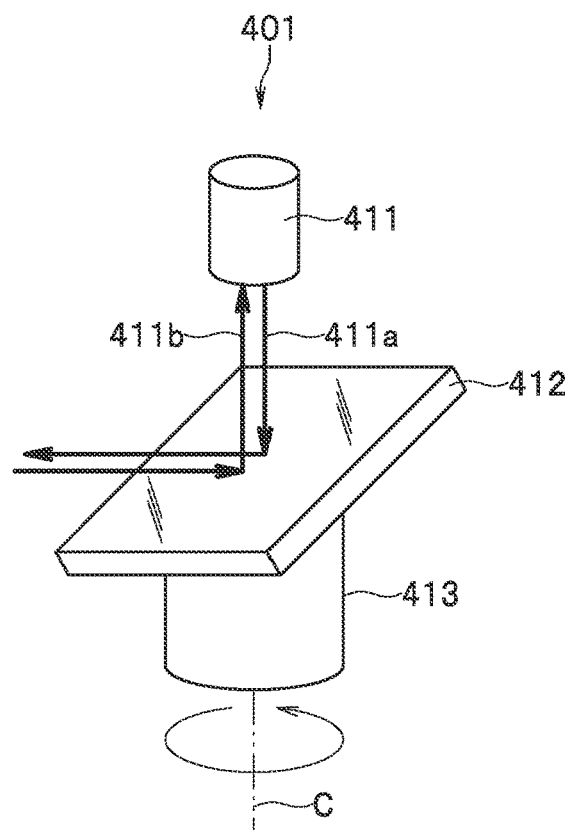
FIG. 17 is a perspective view showing a distance measuring device according to a third example embodiment of the technology.

Next, a distance measuring device according to a third example embodiment of the technology will be described with reference to FIG. 17. FIG. 17 is a perspective view showing the distance measuring device according to the present example embodiment.

A distance measuring device 401 shown in FIG. 17 is a device that measures a distance to a target object by detecting applied light, and constitutes, for example, a part of light detection and ranging (LIDAR) for automotive use. In the example shown in FIG. 17, the distance measuring device 401 includes a photoelectric unit 411, an optical element 412, and a not-shown driving unit.

The photoelectric unit 411 includes an optical element that applies light 411a, and a detection element that detects reflected light 411b from a target object. The optical element 412 may be, for example, a mirror supported by a support 413. The optical element 412 is inclined with respect to an emission surface of the optical element such that a traveling direction of each of the light 411a and the reflected light 411b is changed. The optical element 412 is configured to rotate about a predetermined rotation axis by the not-shown driving unit.

The distance measuring device 401 further includes a position detection device for detecting a rotation position of the optical element 412. The position detection device is a magnetic position detection device, and includes the magnetic sensor 2 described in the first example embodiment and a magnetic field generator of the present example embodiment. The magnetic field generator of the present example embodiment is configured to rotate about a predetermined rotation axis in conjunction with the optical element 412. The magnetic field generator may rotate about the same rotation axis as that of the optical element 412, or may rotate about the rotation axis different from that of the optical element 412. In the present example embodiment, for the sake of convenience, the optical element 412 and the magnetic field generator rotate about the same rotation axis C.

Figure 18:
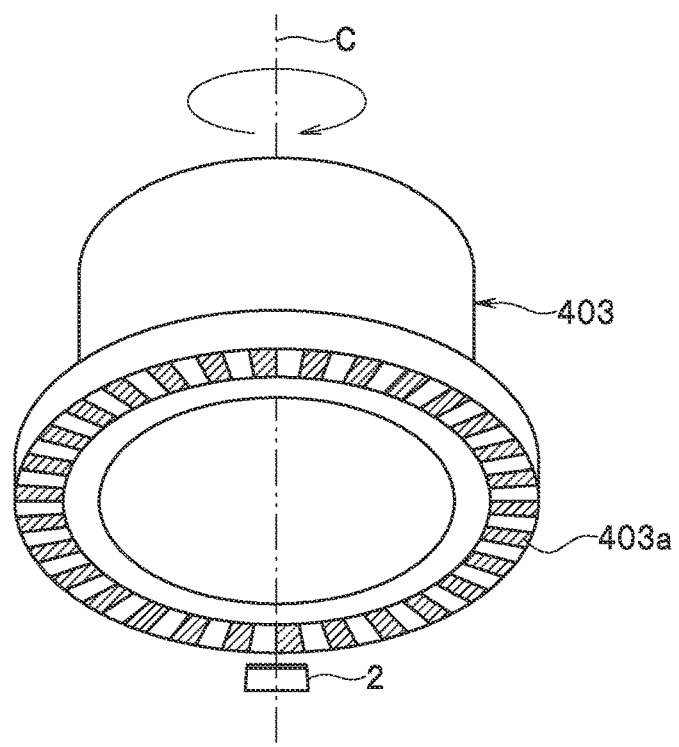
FIG. 18 is a perspective view showing a first example of a magnetic field generator of the distance measuring device according to the third example embodiment of the technology.
Figure 19:
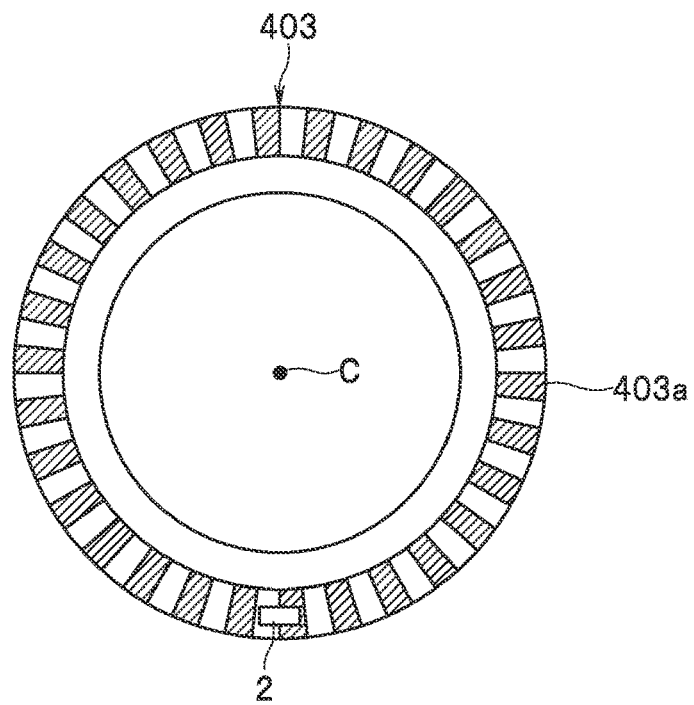
FIG. 19 is a plan view showing the first example of the magnetic field generator of the distance measuring device according to the third example embodiment of the technology.

The magnetic field generator is a magnetic scale (rotation scale) including a plurality of pairs of N and S poles alternately arranged around the rotation axis C. Here, a first example and a second example of the magnetic field generator will be described. The first example will initially be described with reference to FIGS. 18 and 19. FIG. 18 is a perspective view showing the first example of the magnetic field generator. FIG. 19 is a plan view showing the first example of the magnetic field generator.

A magnetic field generator 403 of the first example includes an end surface 403a located at an end in one direction parallel to the rotation axis C. The plurality of pairs of N and S poles are provided on the end surface 403a. In FIGS. 18 and 19, for ease of understanding, the N pole is shown with hatching. The magnetic sensor 2 is located so as to face the end surface 403a. The strength of the magnetic field component MFx (see FIG. 2) in a reference position, for example, a position in which the magnetic sensor 2 is located changes according to rotation of the magnetic field generator 403.

In the first example, two directions orthogonal to the rotation axis C may be the X direction and the Y direction, and a direction parallel to the rotation axis C and directed from the magnetic sensor 2 to the magnetic field generator 403 may be the Z direction. The Y direction may be a direction directed from the rotation axis C to the magnetic sensor 2.

Figure 20:
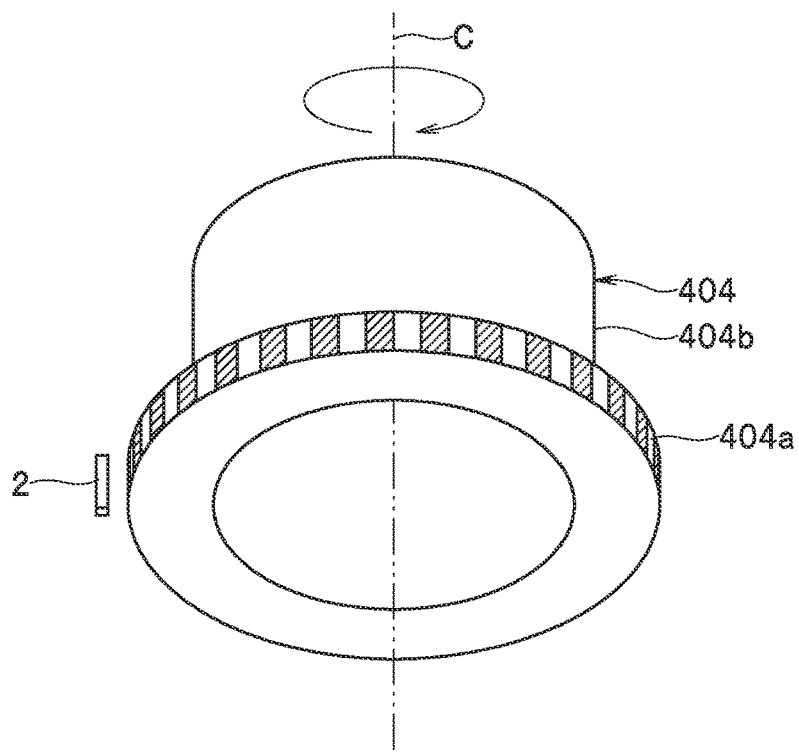
FIG. 20 is a perspective view showing a second example of the magnetic field generator of the distance measuring device according to the third example embodiment of the technology.

Next, the second example will be described with reference to FIG. 20. FIG. 20 is a perspective view showing the second example of the magnetic field generator. A magnetic field generator 404 of the second example includes outer circumferential surfaces 404a and 404b each directed to a direction away from the rotation axis C. The outer circumferential surfaces 404a and 404b are located in positions different from each other in the direction parallel to the rotation axis C. The outer circumferential surface 404a is located at a position away from the rotation axis C farther than the outer circumferential surface 404b.

The plurality of pairs of N and S poles are provided on the outer circumferential surface 404a. In FIG. 20, for ease of understanding, the N pole is shown with hatching. The magnetic sensor 2 is located so as to face the outer circumferential surface 404a. The strength of the magnetic field component MFx (see FIG. 2) in a reference position, for example, a position in which the magnetic sensor 2 is located changes according to rotation of the magnetic field generator 404.

In the second example, a direction parallel to the rotation axis C may be the Y direction, and a direction orthogonal to the rotation axis C and directed from the magnetic sensor 2 to the rotation axis C may be the Z direction.

The distance measuring device 401 further includes the detection value generation circuit 4 described in the first example embodiment (see FIG. 4). The distance measuring device 401 generates a detection value Vs having a correspondence with the rotation position of the optical element 412 on the basis of the first and second detection signals S1 and S2 generated by the magnetic sensor 2. Note that the rotation position of the optical element 412 has a correspondence with the rotation position of the magnetic field generator 403 or 404.

The configuration, operation and effects of the present example embodiment are otherwise the same as those of the first example embodiment.

Fourth Example Embodiment

Figure 21:
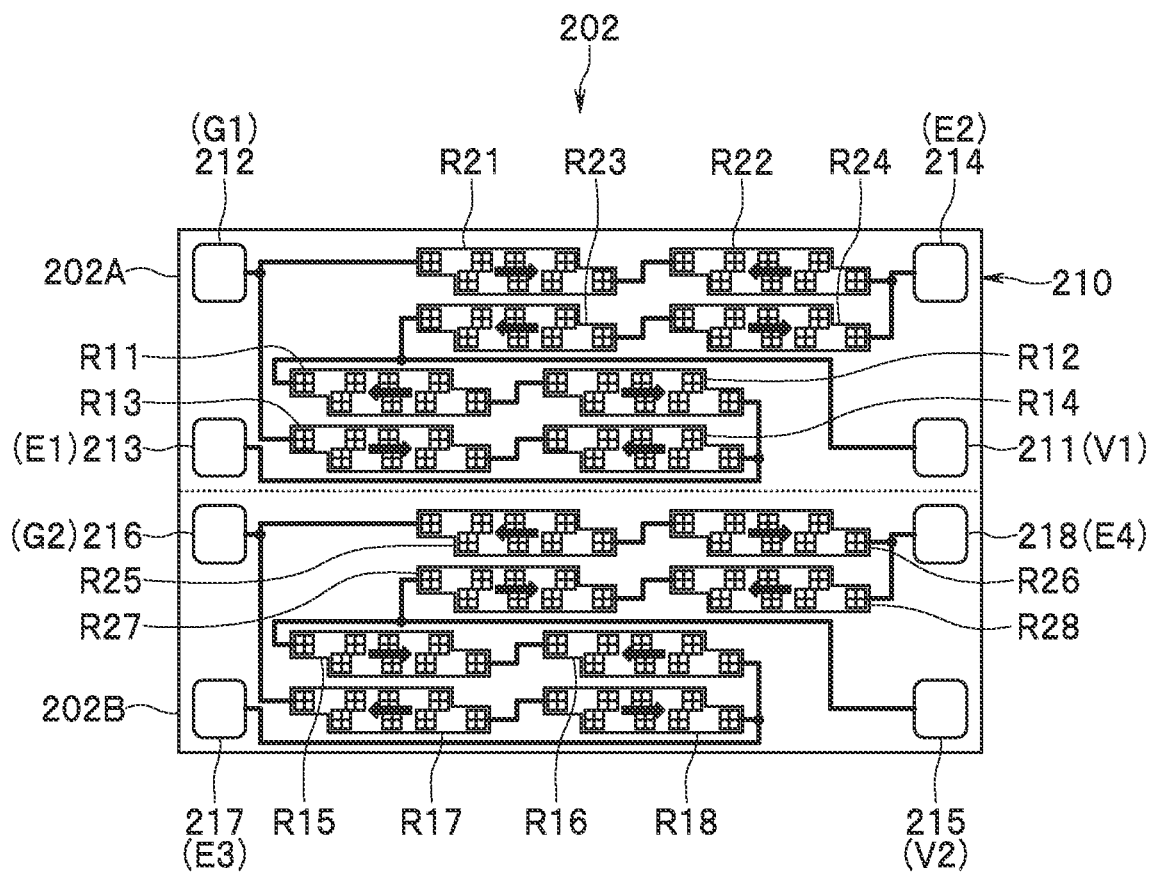
FIG. 21 is a plan view showing a magnetic sensor according to a fourth example embodiment of the technology.
Figure 22:
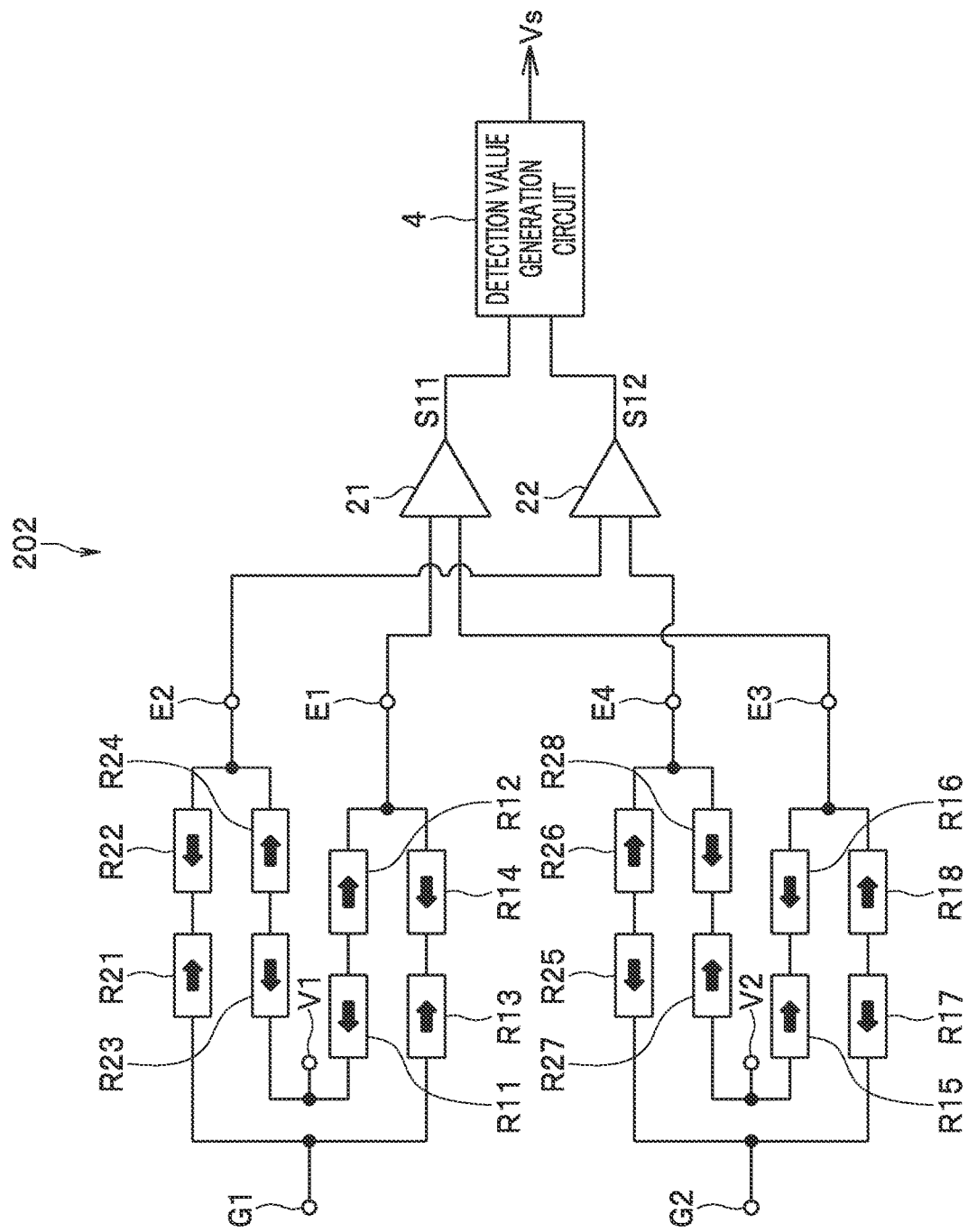
FIG. 22 is a circuit diagram showing the configuration of the magnetic sensor according to the fourth example embodiment of the technology.

Next, a fourth example embodiment of the technology will be described with reference to FIGS. 21 and 22. FIG. 21 is a plan view showing a magnetic sensor according to the present example embodiment. FIG. 22 is a circuit diagram showing the configuration of the magnetic sensor according to the present example embodiment.

A magnetic sensor 202 according to the present example embodiment includes all of the components of the magnetic sensor 2 according to the first example embodiment except for the substrate 10 and the terminals 11 to 14. In other words, the magnetic sensor 202 includes first to eighth resistors R11 to R14 and R21 to R24, a power supply port V1, a ground port G1, a first output port E1, and a second output port E2. The configuration of the first to eighth resistors R11 to R14 and R21 to R24, and the layout of the first to eighth resistors R11 to R14 and R21 to R24 in a circuit configuration are the same as those of the first example embodiment.

The magnetic sensor 202 further includes a ninth resistor R15, a tenth resistor R16, an eleventh resistor R17, a twelfth resistor R18, a thirteenth resistor R25, a fourteenth resistor R26, a fifteenth resistor R27, and a sixteenth resistor R28. Each of the ninth to sixteenth resistors R15 to R18 and R25 to R28 is formed of a plurality of MR elements 50.

The magnetic sensor 202 further includes a power supply port V2, a third output port E3, and a fourth output port E4. The ground ports G1 and G2 are connected to the ground. The magnetic sensor 202 may be driven by a constant voltage or driven by a constant current. In the case where the magnetic sensor 202 is driven by a constant voltage, a voltage of predetermined magnitude is applied to each of the power supply ports V1 and V2. In the case where the magnetic sensor 202 is driven by a constant current, a current of predetermined magnitude is supplied to each of the power supply ports V1 and V2.

The magnetic sensor 202 further includes two differential detectors 21 and 22. The differential detector 21 outputs a signal corresponding to a potential difference between the first and third output ports E1 and E3 as a first detection signal S11. The differential detector 22 outputs a signal corresponding to a potential difference between the second and fourth output ports E2 and E4 as a second detection signal S12.

The differential detectors 21 and 22 are connected to a detection value generation circuit 4. In the present example embodiment, the detection value generation circuit 4 generates a detection value Vs on the basis of the first and second detection signals S11 and S12. At least one of the magnetic sensor 202 and the detection value generation circuit 4 may be configured to be able to correct the amplitude, phase, and offset of each of the first and second detection signals S11 and S12. The method for generating the detection value Vs is the same as that of the first example embodiment except that the first and second detection signals S11 and S12 are used instead of the first and second detection signals S1 and S2.

The ninth resistor R15 and the tenth resistor R16 are provided in this order from the power supply port V2 side in a path that connects the power supply port V2 and the third output port E3. The eleventh resistor R17 and the twelfth resistor R18 are provided in this order from the ground port G2 side in a path that connects the ground port G2 and the third output port E3. The thirteenth resistor R25 and the fourteenth resistor R26 are provided in this order from the ground port G2 side in a path that connects the ground port G2 and the fourth output port E4. The fifteenth resistor R27 and the sixteenth resistor R28 are provided in this order from the power supply port V2 side in a path that connects the power supply port V2 and the fourth output port E4.

A first magnetization of a magnetization pinned layer in the ninth, twelfth, fourteenth, and fifteenth resistors R15, R18, R26, and R27 contains a component in a second magnetization direction (the X direction). A first magnetization of a magnetization pinned layer in the tenth, eleventh, thirteenth, and sixteenth resistors R16, R17, R25, and R28 contains a component in a first magnetization direction (the −X direction).

Each of the ninth to sixteenth resistors R15 to R18 and R25 to R28 includes a plurality of element groups. A configuration and layout of the plurality of element groups in each of the ninth to sixteenth resistors R15 to R18 and R25 to R28 are the same as those of the plurality of element groups in the first resistor R11 of the magnetic sensor 2 according to the first example embodiment.

As shown in FIG. 21, the magnetic sensor 202 further includes a substrate 210, and power supply terminals 211 and 215, ground terminals 212 and 216, a first output terminal 213, a second output terminal 214, a third output terminal 217, and a fourth output terminal 218 that are located on the substrate 210. The power supply terminal 211 constitutes the power supply port V1. The power supply terminal 215 constitutes the power supply port V2. The ground terminal 212 constitutes the ground port G1. The ground terminal 216 constitutes the ground port G2. The first to fourth output terminals 213, 214, 217, and 218 constitute the first to fourth output ports E1, E2, E3, and E4, respectively.

Here, as shown in FIG. 21, the magnetic sensor 202 is divided between a first portion 202A and a second portion 202B. In FIG. 21, a border between the first and second portions 202A and 202B is shown by a dotted line. The second portion 202B is located in front of the first portion 202A in the Y direction. The first portion 202A includes the first to eighth resistors R11 to R14 and R21 to R24, the power supply terminal 211, the ground terminal 212, and the first and second output terminals 213 and 214. The second portion 202B includes the ninth to sixteenth resistors R15 to R18 and R25 to R28, the power supply terminal 215, the ground terminal 216, and the third and fourth output terminals 217 and 218.

The physical layout of the first to eighth resistors R11 to R14 and R21 to R24 in the first portion 202A is the same as that of the first to eighth resistors R11 to R14 and R21 to R24 of the first example embodiment, respectively. The physical layout of the ninth to sixteenth resistors R15 to R18 and R25 to R28 in the second portion 202B is the same as that of the first to eighth resistors R11 to R14 and R21 to R24 of the first example embodiment, respectively.

The ninth and eleventh resistors R15 and R17 are located at the same position as the first and third resistors R11 and R13 are in the X direction. The tenth and twelfth resistors R16 and R18 are located at the same position as the second and fourth resistors R12 and R14 are in the X direction. The thirteenth and fifteenth resistors R25 and R27 are located at the same position as the fifth and seventh resistors R21 and R23 are in the X direction. The fourteenth and sixteenth resistors R26 and R28 are located at the same position as the sixth and eighth resistors R22 and R24 are in the X direction.

The configuration of the first to eighth resistors R11 to R14 and R21 to R24 and the ninth to sixteenth resistors R15 to R18 and R25 to R28 described above makes a phase difference of an ideal component of the second detection signal S12 from an ideal component of the first detection signal S11 an odd number of times ¼ of a predetermined signal period (the signal period of the ideal component).

The configuration, operation and effects of the present example embodiment are otherwise the same as those of the first example embodiment.

The technology is not limited to the foregoing example embodiments, and various modifications may be made thereto. For example, the number and layout of the MR elements 50 are not limited to the examples described in the example embodiments but may be freely set as long as the requirements set forth in the claims are satisfied.

Each of the first to eighth positions C11 to C14 and C21 to C24 may be a position other than the center of gravity, such as an end portion of a corresponding resistor in the −X direction.

In the first to third example embodiments, the third, fourth, seventh, and eighth resistors R13, R14, R23, and R24 may be located at a position an integral number of times of the pitch λ away from the first, second, fifth, and sixth resistors R11, R12, R21, and R22 in the X direction or the −X direction, respectively.

In the fourth example embodiment, the ninth to sixteenth resistors R15 to R18 and R25 to R28 may be located at a position an integral number of times of the pitch λ away from the first to eighth resistors R11 to R14 and R21 to R24 in the X direction or the −X direction, respectively.

In the fourth example embodiment, the first portion 202A and the second portion 202B may be separated. In the fourth example embodiment, the resistors R11 to R18 may constitute a first Wheatstone bridge circuit, and the resistors R21 to R28 may constitute a second Wheatstone bridge circuit.

Obviously, many modifications and variations of the technology are possible in the light of the above teachings. Thus, it is to be understood that, within the scope of the appended claims and equivalents thereof, the technology may be practiced in other example embodiments than the foregoing example embodiments.

What is claimed is:

1. A magnetic sensor configured to detect a target magnetic field including a magnetic field component in a first direction, the magnetic sensor comprising:
   a first resistor, a second resistor, a third resistor, and a fourth resistor each configured to change in resistance with change in strength of the magnetic field component;
   a power supply port;
   a ground port; and
   a first output port, wherein
   the first resistor and the second resistor are provided in this order from the power supply port side in a first path that connects the power supply port and the first output port,
   the third resistor and the fourth resistor are provided in this order from the ground port side in a second path that connects the ground port and the first output port,
   a distance between a first position in the first resistor and a second position in the second resistor in the first direction is equal to an odd number of times ½ of a predetermined pitch,
   a distance between a third position in the third resistor and a fourth position in the fourth resistor in the first direction is equal to an odd number of times ½ of the predetermined pitch,
   a distance between the first position and the third position in the first direction is equal to zero or an integral number of times of the predetermined pitch,
   the predetermined pitch is a length corresponding to one period of a change in the strength of the magnetic field component, wherein the strength of the magnetic field component periodically changes with a predetermined period along the first direction,
   the magnetic sensor further includes a plurality of magnetoresistive elements,
   each of the plurality of magnetoresistive elements includes a magnetization pinned layer, a free layer, and a gap layer located between the magnetization pinned layer and the free layer,
   the magnetization pinned layer has a first magnetization whose direction is fixed,
   the free layer has a second magnetization whose direction is variable within a plane parallel to both of the first direction and a second direction orthogonal to the first direction,
   the magnetization pinned layer, the free layer, and the gap layer are stacked in a third direction orthogonal to the first direction and the second direction,
   the first to fourth resistors are formed of the plurality of magnetoresistive elements,
   the first magnetization of the magnetization pinned layer in the first and fourth resistors contains a component in a first magnetization direction being one direction parallel to the first direction, and the first magnetization of the magnetization pinned layer in the second and third resistors contains a component in a second magnetization direction opposite to the first magnetization direction.

2. The magnetic sensor according to claim 1, wherein:
the first position is a center of gravity of the first resistor when viewed in one direction parallel to the third direction;
the second position is a center of gravity of the second resistor when viewed in one direction parallel to the third direction;
the third position is a center of gravity of the third resistor when viewed in one direction parallel to the third direction; and
the fourth position is a center of gravity of the fourth resistor when viewed in one direction parallel to the third direction.

3. The magnetic sensor according to claim 1, wherein:
the first resistor and the third resistor adjoin in the second direction; and
the second resistor and the fourth resistor adjoin in the second direction.

4. The magnetic sensor according to claim 1, further comprising:
a fifth resistor, a sixth resistor, a seventh resistor, and an eighth resistor each configured to change in resistance with change in the strength of the magnetic field component; and
a second output port, wherein
the fifth resistor and the sixth resistor are provided in this order from the ground port side in a third path that connects the ground port and the second output port,
the seventh resistor and the eighth resistor are provided in this order from the power supply port side in a fourth path that connects the power supply port and the second output port,
a distance between a fifth position in the fifth resistor and a sixth position in the sixth resistor in the first direction is equal to an odd number of times ½ of the predetermined pitch,
a distance between a seventh position in the seventh resistor and an eighth position in the eighth resistor in the first direction is equal to an odd number of times ½ of the predetermined pitch,
a distance between the fifth position and the seventh position in the first direction is equal to zero or an integral number of times of the predetermined pitch,
a distance between the first position and the fifth position in the first direction is equal to (4n−3)/4 of the predetermined pitch when n is an integer of 1 or more,
the fifth to eighth resistors are formed of the plurality of magnetoresistive elements,
the first magnetization of the magnetization pinned layer in the fifth and eighth resistors contains a component in the second magnetization direction, and
the first magnetization of the magnetization pinned layer in the sixth and seventh resistors contains a component in the first magnetization direction.

5. The magnetic sensor according to claim 4, wherein:
the fifth position is a center of gravity of the fifth resistor when viewed in one direction parallel to the third direction;
the sixth position is a center of gravity of the sixth resistor when viewed in one direction parallel to the third direction;

the seventh position is a center of gravity of the seventh resistor when viewed in one direction parallel to the third direction; and
the eighth position is a center of gravity of the eighth resistor when viewed in one direction parallel to the third direction.

6. The magnetic sensor according to claim 4, wherein:
the fifth resistor and the seventh resistor adjoin in the second direction; and
the sixth resistor and the eighth resistor adjoin in the second direction.

7. The magnetic sensor according to claim 4, wherein:
the first resistor adjoins to the seventh resistor and does not adjoin to the eighth resistor; and
the eighth resistor adjoins to the second resistor and does not adjoin to the first resistor.

8. The magnetic sensor according to claim 7, wherein:
the third resistor is located at a position such that the first resistor is sandwiched between the third resistor and the seventh resistor;
the fourth resistor is located at a position such that the second resistor is sandwiched between the fourth resistor and the eighth resistor;
the fifth resistor is located at a position such that the seventh resistor is sandwiched between the fifth resistor and the first resistor; and
the sixth resistor is located at a position such that the eighth resistor is sandwiched between the sixth resistor and the second resistor.

9. The magnetic sensor according to claim 1, wherein each of the plurality of magnetoresistive elements is configured such that a bias magnetic field in a direction intersecting the first direction and the third direction is applied to the free layer.

10. The magnetic sensor according to claim 1, wherein the gap layer is a tunnel barrier layer.

11. A magnetic encoder comprising:
the magnetic sensor according to claim 1; and
a magnetic field generator configured to generate the target magnetic field, wherein
the magnetic sensor and the magnetic field generator are configured so that the strength of the magnetic field component in a reference position changes when at least one of the magnetic sensor and the magnetic field generator operates.

12. A lens position detection device for detecting a position of a lens whose position is variable, the lens position detection device comprising:
the magnetic sensor according to claim 1; and
a magnetic field generator configured to generate the target magnetic field, wherein
the lens is configured to be movable in the first direction, and
the magnetic sensor and the magnetic field generator are configured so that the strength of the magnetic field component changes with a change in the position of the lens.

13. The lens position detection device according to claim 12, wherein the magnetic field generator is a magnetic scale including a plurality of pairs of N and S poles alternately arranged in the first direction.

14. A distance measuring device for measuring a distance to a target object by detecting applied light, the distance measuring device comprising:
an optical element configured to rotate together when a traveling direction of the light changes;
the magnetic sensor according to claim 1; and a magnetic field generator configured to generate the target magnetic field, wherein the magnetic field generator is configured to rotate about a rotation axis in conjunction with the optical element, and the strength of the magnetic field component in a reference position changes according to rotation of the magnetic field generator.

15. The distance measuring device according to claim 14, wherein the magnetic field generator is a magnetic scale including a plurality of pairs of N and S poles alternately arranged around the rotation axis.

16. The distance measuring device according to claim 15, wherein:

the magnetic field generator includes an end surface located at an end in one direction parallel to the rotation axis;

the plurality of pairs of N and S poles are provided on the end surface; and the magnetic sensor is located to face the end surface.

17. The distance measuring device according to claim 15, wherein:

the magnetic field generator includes an outer circumferential surface directed to a direction away from the rotation axis;

the plurality of pairs of N and S poles are provided on the outer circumferential surface; and the magnetic sensor is located to face the outer circumferential surface.

18. A manufacturing method for a magnetic sensor, the magnetic sensor being according to claim 1, the manufacturing method comprising:

forming a plurality of magnetoresistive elements, wherein the forming the plurality of magnetoresistive elements includes:

forming a plurality of initial magnetoresistive elements each including an initial magnetization pinned layer to later become the magnetization pinned layer, the free layer, and the gap layer; and fixing the first magnetization direction of the initial magnetization pinned layer by using laser light and an external magnetic field.

* * * * *